(12) United States Patent
Ishida et al.

(10) Patent No.: US 6,505,553 B2
(45) Date of Patent: Jan. 14, 2003

(54) SCREEN PRINTING METHOD AND SCREEN PRINTING APPARATUS

(75) Inventors: Nobumichi Ishida, Kakamigahara (JP); Toshinori Shimizu, Kariya (JP); Manabu Mizuno, Toyota (JP)

(73) Assignee: Fuji Machine Mfg. Co., Ltd, Chiyru (JP)

( * ) Notice: Subject to any disclaimer, the term of this patent is extended or adjusted under 35 U.S.C. 154(b) by 0 days.

(21) Appl. No.: 09/822,264

(22) Filed: Apr. 2, 2001

(65) Prior Publication Data

US 2001/0032556 A1 Oct. 25, 2001

(30) Foreign Application Priority Data

Apr. 24, 2000 (JP) .................................. 2000-122743

(51) Int. Cl.[7] .............................. B41F 15/08; B41M 1/12
(52) U.S. Cl. ...................... 101/129; 101/123; 101/126; 101/127.1
(58) Field of Search ................................. 101/114, 126, 101/123, 124, 129, 127, 127.1, 485, 486, 481, DIG. 36; 427/96, 282; 118/213, 406

(56) References Cited

U.S. PATENT DOCUMENTS

| | | | | |
|---|---|---|---|---|
| 5,623,872 A | * | 4/1997 | Tomomatsu | 101/126 |
| 5,878,661 A | * | 3/1999 | Glovatsky et al. | 101/127 |
| 6,016,746 A | * | 1/2000 | Lake et al. | 101/123 |
| 6,036,994 A | * | 3/2000 | Tanaka et al. | 101/126 |
| 6,058,835 A | * | 5/2000 | Isogai et al. | |
| 6,192,795 B1 | | 2/2001 | D'Alessandro | 101/127.1 |

FOREIGN PATENT DOCUMENTS

| JP | B2 2-13475 | | 4/1990 |
|---|---|---|---|
| JP | 5-131609 | * | 5/1993 |

* cited by examiner

Primary Examiner—Leslie J. Evanisko
(74) Attorney, Agent, or Firm—Oliff & Berridge, PLC

(57) ABSTRACT

A screen-printing method, including the steps of filling, in a state in which a screen having through-holes is contacted with a print surface of a substrate, the through-holes with a print material, and thereby applying the print material to the print surface of the substrate, moving, after the filling step, one of the screen and the substrate relative to the other of the screen and the substrate, in one or more cycles, on a plane parallel to the print surface of the substrate, in one or more directions parallel to one or more straight lines, and separating, after the moving step, the screen and the substrate from each other.

24 Claims, 17 Drawing Sheets

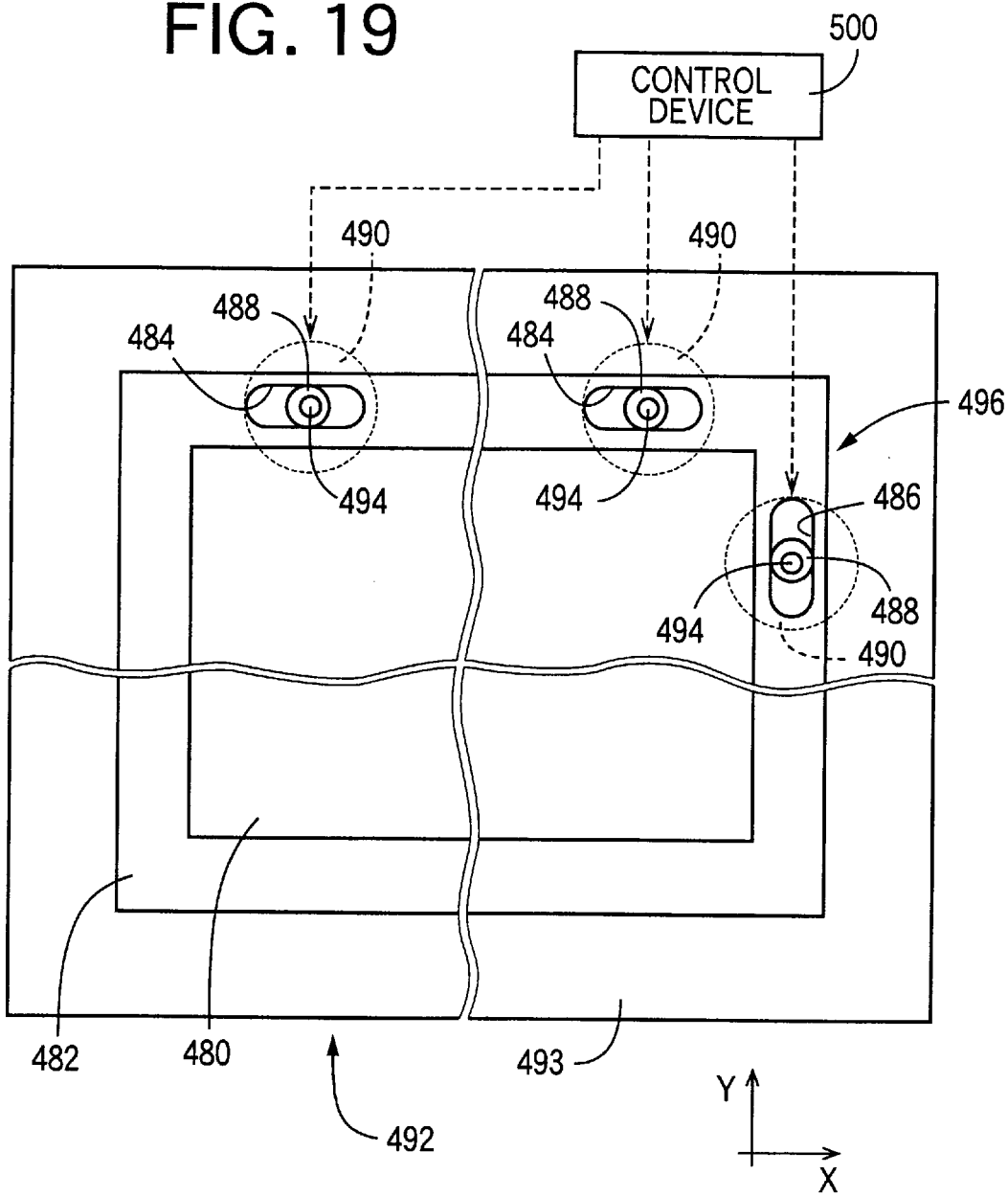

SCREEN PRINTING METHOD AND SCREEN PRINTING APPARATUS

BACKGROUND OF THE INVENTION

1. Field of the Invention

The present invention relates to a screen-printing method and a screen-printing apparatus and particularly to the art of facilitating the separation from a screen of a print material printed on a substrate.

2. Discussion of Related Art

A screen printing is carried out by filling, in a state in which a screen is contacted with a substrate such as a printed wiring board, through-holes of the screen with a print material such as creamed solder, and thereby applying the print material to the substrate. After the printing operation, the screen is separated from the substrate, so that the print material is separated from the screen and is left on the substrate. Thus, the print material is printed on the substrate.

However, there is a problem that when the screen and the substrate are separated from each other after the printing operation, a certain amount of the print material remains adhered to respective inner surfaces of the through-holes of the screen, so that an amount of the printing material left on the substrate may be short or a print pattern formed on the substrate may have a defect.

SUMMARY OF THE INVENTION

The present invention provides a screen-printing method and a screen-printing apparatus which have one or more of the following technical features that are described below in respective paragraphs given parenthesized sequential numbers (1) to (19). Any technical feature that includes another technical feature shall do so by referring, at the beginning, to the parenthesized sequential number given to the latter feature. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items.

(1) According to a first feature of the present invention, there is provided a screen-printing method, comprising the steps of filling, in a state in which a screen having a plurality of through-holes is contacted with a print surface of a substrate, the through-holes with a print material, and thereby applying the print material to the print surface of the substrate, moving, after the filling step, at least one of the screen and the substrate relative to the other of the screen and the substrate, in at least one cycle, on a plane parallel to the print surface of the substrate, in at least one direction parallel to at least one straight line, and separating, after the moving step, the screen and the substrate from each other.

When one of the screen and the substrate is moved relative to the other of the screen and the substrate, in a direction parallel to the print surface of the substrate, the print material, i.e., a print pattern formed by the print material filled in a through-hole and applied to the substrate is moved relative to the through-hole, so that a clearance is produced between a portion of the entire periphery of the print pattern and an inner surface of the through-hole. Therefore, when the screen and the substrate are separated from each other after the relative movement thereof, the print pattern is easily separated from the through-hole, such that no print material, or only a small amount of print material, if any, is left on the side of the screen. Thus, the present screen-printing method is free of the problems that the print material is short or the print pattern has a defect.

The number of cycles in which the screen and the substrate are moved relative to each other may be determined depending on, for example, the degree of difficulty of printing or the degree of difficulty of separation of the print pattern from the through-holes. For example, in the case where the screen has a constant thickness and the through-holes have a substantially identical cross-sectional shape, the degree of difficulty of separation of the print pattern increases as the cross-sectional area of the through-holes decreases. Therefore, the number of cycles increases. In this case, a circular through-hole and a square through-hole are defined as having a substantially identical cross-sectional shape. In addition, in the case where the screen has a constant thickness, and the through-holes have different cross-sectional shapes but have a substantially identical cross-sectional area, the degree of difficulty of separation of the print pattern increases and the number of cycles increases as a value (i.e., a ratio) obtained by dividing a maximum inner dimension of each through-hole by a minimum inner dimension thereof increases. For example, in the case where the through-holes have a rectangular, shape, the above ratio increases as the length of the short sides of the rectangular through-holes decreases. Moreover, as a value (i.e., a ratio) obtained by dividing the depth of each through-hole by the cross-sectional area thereof increases, the degree of difficulty of separation of the print pattern increases and the number of cycles increases. If the number of cycles is determined in this way, then it is assured that respective clearances are produced between the print pattern and the respective inner surfaces of the through-holes, according to the shape, dimensions, and/or height (i.e., depth) of each through-hole, and that the screen and the substrate are moved relative to each other with a small amount of waste.

(2) According to a second feature of the present invention that includes the first feature (1), the one cycle comprises a first forward movement of the at least one of the screen and the substrate by a distance α, a backward movement of the at least one of the screen and the substrate by twice the distance α, and a second forward movement of the at least one of the screen and the substrate by the distance α, in an order of description.

According to this feature, in a state after the second forward movement following the backward movement, two clearances each having a dimension substantially equal to the distance α, are produced between opposite end portions of each print pattern as seen in the direction of relative movement of the screen and the substrate, and opposite end portions of an inner surface of a corresponding through-hole as seen in the same direction. Although the size of each print pattern is decreased since the clearances are produced, the center of the each print pattern is not moved in the above-indicated direction and accordingly the each print pattern is formed at a correct position. Thus, for example, in the case where the substrate is a printed wiring board and the print material is creamed solder, when an electric component having a lead wire is mounted on the wiring board, the lead wire is placed at the center of a print pattern in a widthwise direction thereof, so that an electric circuit (i.e., an electric-conductor pattern) is produced with reliability.

(3) According to a third feature of the present invention that includes the second feature (2), the distance a is not smaller than one hundredth of an inner dimension of one of the through-holes in the one direction and not greater than one fifth of the inner dimension.

In the case where all the through-holes are elongate in the one direction parallel to the one straight line, the relative movement of the screen and the substrate in one or more cycles in only the one direction suffices in many cases. More specifically described, providing that an elongate through-hole is divided into unit-length portions in a lengthwise direction thereof lengthwise opposite end unit-length portions of the through-hole are more contacted with a print pattern than intermediate unit-length portions of the through-hole and, when the screen is separated from the substrate, the print material has a difficulty to separate from the inner surface of the through-hole and accordingly a certain amount of the material is left on the side of the screen. In contrast, when the screen and the substrate are moved relative to each other in a direction parallel to the lengthwise direction of a through-hole, the through-hole and a print pattern are moved relative to each other in the direction parallel to the lengthwise direction of the through-hole, so that respective clearances are produced between the lengthwise opposite end portions of the print pattern and the lengthwise opposite end portions of the inner surface of the through-hole, where the print material has a difficulty to separate from the through-hole. Thus, the print material can be easily separated from the through-hole. Since the clearances are present in the lengthwise opposite end portions of the through-hole, the print pattern is contacted with the lengthwise opposite end portions of a pair of long sides of the through-hole, by the same area as that by which the print pattern is contacted with the other, intermediate portions of the long sides of the through-hole.

If the distance $\alpha$ is too small, the advantage is too low; and if the distance $\alpha$ is too great, the print pattern as the shape of the print material printed is deformed too much. Hence, it is preferred that a lower limit of the distance a be one two-hundred-and-fiftieth, one hundredth, two hundredths, or three hundredths of an inner dimension of one through-hole and that an upper limit of the distance $\alpha$ be one fifth, fifteen hundredths, ten hundredths, or seven hundredths of the inner dimension. The dimension of each of the clearances produced between a print pattern and a through-hole may be generally proportional to the inner dimension of the through-hole in the direction of movement of the through-hole. However, even if the inner dimension of the through-hole may be considerably small, the dimension of each clearance needs to be greater than a certain lower limit; and even if the inner dimension may be considerably great, the dimension of each clearance need not to be greater than a certain upper limit. Thus, it is natural that the dimension of each clearance should have an upper and a lower limit. Upper and lower limits of a ratio of the distance a to the inner dimension of a through-hole decreases as the inner dimension increases, and vice versa. This ratio changes depending upon the inner dimension of the through-hole. More specifically described, the upper and lower limits of the ratio are selected from a range of greater ratios in the case where the inner dimension is smaller; and the upper and lower limits of the ratio are selected from a range of smaller ratios in the case where the inner dimension is greater. However, generally, it is preferred that the distance $\alpha$ have the above-indicated upper and lower limits.

(4) According to a third feature of the present invention that includes any one of the first to third features (1) to (3), the plurality of through-holes comprise at least one first elongate hole which is elongate in a first direction parallel to a first straight line parallel to the print surface, and at least one second elongate hole which is elongate in a second direction parallel to a second straight line parallel to the print surface and perpendicular to the first straight line, and the moving step comprises moving, in each of the first and second directions, the at least one of the screen and the substrate relative to the other of the screen and the substrate, in the at least one cycle.

The advantage is obtained to some extent by moving, in one or more cycles, one of the screen and the substrate relative to the other of the screen and the substrate in only one direction parallel to one of the first and second straight lines. However, it is preferred to move, as described above, one of the screen and the substrate relative to the other of the screen and the substrate, because the first elongate hole is moved relative to a corresponding print pattern in the first direction, i.e., in the lengthwise direction thereof, and the second elongate hole is moved relative to a corresponding print pattern in the second direction, i.e., in the lengthwise direction thereof. The relative movement of the screen and the substrate in the first direction parallel to the first straight line, and the relative movement of the screen and the substrate in the second direction parallel to the second straight line may be effected at fully different timings, or at least partly concurrently. The latter manner may be carried out by moving, in at least a portion of the duration of the moving step, one of the screen and the substrate relative to the other of the screen and the substrate so as to describe a circular locus. In the latter manner, if the screen is moved relative to the substrate to describe a circular locus and additionally an arbitrary point on the screen is moved, during one cycle, relative to the substrate in a substantially diametrical direction of the circle, in the order recited in the second feature (2), a uniform clearance is produced around the entire periphery of a print pattern.

(5) According to a fifth feature of the present invention that includes any one of the first to third features (1) to (3), the plurality of through-holes comprise at least one first elongate hole which is elongate in a first direction parallel to a first straight line parallel to the print surface, and at least one second elongate hole which is elongate in a second direction parallel to a second straight line parallel to the print surface and perpendicular to the first straight line, and the moving step comprises moving, in a third direction parallel to a third straight line inclined with respect to each of the first and second straight lines and parallel to the print surface, the at least one of the screen and the substrate relative to the other of the screen and the substrate, in the at least one cycle.

According to this feature, the third straight line has a first component parallel to the first straight line and a second component parallel to the second straight line, and each of the first and second elongate holes and a corresponding one of two sorts of print patterns formed by filling those elongate holes with the print material are moved relative to each other, concurrently in both the lengthwise direction of the each elongate hole and a direction perpendicular to the lengthwise direction. Therefore, a clearance is efficiently produced around the entire periphery of each print pattern.

(6) According to a sixth feature of the present invention that includes any one of the first to third feature (1) to (3), the moving step comprises moving the at least one of the screen and the substrate relative to the other of the screen and the substrate, in the at least one cycle, on the plane parallel to the print surface of the substrate, in each of an X-axis direction and a Y-axis direction parallel to an X axis and a Y axis, respectively, which are perpendicular to each other on the plane.

The explanations provided for the fourth feature (4) are true with the present feature.

(7) According to a seventh feature of the present invention that includes the sixth feature (6), the moving step comprises moving the at least one of the screen and the substrate relative to the other of the screen and the substrate, to describe such a relative-movement locus that an arbitrary point on the screen moves, relative to the substrate, from an initial position of the arbitrary point to a point on a circle whose center is the initial position, and then moves on the circle.

According to this feature, a clearance is produced between almost the entire periphery of a print pattern and an inner surface of a through-hole, without moving the center of the print pattern out of position.

(8) According to an eighth feature of the present invention that includes the seventh feature (7), a portion of the relative-movement locus that corresponds to the movement of the arbitrary point from the initial position thereof to the point on the circle whose center is the initial position, comprises a first component in a circumferential direction of the circle and a second component in a radial direction of the circle.

Otherwise, the relative-movement locus may be one which consists of the second component in the radial direction of the circle. However, when an inner surface of a through-hole is moved relative to a print pattern to be separated from the print pattern, the shape of the print pattern is less damaged by moving the inner surface in a direction having a component parallel to the inner surface, than by moving the inner surface in a direction perpendicular to the inner surface.

(9) According to a ninth feature of the present invention that includes the eighth feature (8), the portion of the relative- movement locus that comprises the first and second components comprises a spiral curve whose diameter increases as the arbitrary point moves from the initial position thereof toward the circle.

Since the relative-movement locus includes the spiral curve, the shape of the print pattern is less damaged.

(10) According to a tenth feature of the present invention that includes any one of the first to third and sixth features (1) to (3) and (6), the moving step comprises moving the at least one of the screen and the substrate relative to the other of the screen and the substrate, to describe such a relative-movement locus that an arbitrary point on the screen moves, relative to the substrate, from an initial position of the arbitrary point, along a spiral curve whose diameter increases as the arbitrary point moves at least one time around the initial position.

(11) According to an eleventh feature of the present invention that includes any one of the first to third features (1) to (3), the moving step comprises moving the at least one of the screen and the substrate relative to the other of the screen and the substrate, to describe a circle whose center is an arbitrary point on the screen.

(12) According to a twelfth feature of the present invention that includes any one of the seventh to tenth features (7) to (10), the moving step comprises moving the at least one of the screen and the substrate relative to the other of the screen and the substrate, so that the arbitrary point on the screen moves back, relative to the substrate, to the initial position of the arbitrary point.

A relative-movement locus along which one of the screen and the substrate is moved back to its initial position relative to the other of the screen and the substrate may be the same as, or different from, that along which one of the screen and the substrate is moved from its initial position relative to the other of the screen and the substrate.

In each of the screen-printing methods recited in the seventh to ninth features (7) to (9), a portion of the relative-movement locus that corresponds to the movement of an arbitrary point on the screen back to its initial position may be a radius of the circle, or one having both a first component in a circumferential direction and a second component in a radial direction, such as a spiral curve whose radius gradually decreases.

In the screen-printing method recited in the tenth feature (10), a portion of the relative-movement locus that corresponds to the movement of one of the screen and the substrate back to its initial position relative to the other of the screen and the substrate may be a spiral curve, or a radius of a circle whose center is the initial position.

The relative movement of the screen and the substrate back to their initial relative position produces a clearance around the entire periphery of a print pattern, irrespective of which shape the print pattern may have. In particular, in each of the screen-printing methods recited in the seventh to ninth features (7) to (9), a uniform clearance is produced around the entire periphery of a print pattern, without moving the center of the print pattern out of position.

(13) According to a thirteenth feature of the present invention that includes any one of the first to twelfth features (1) to (12), a period of the one cycle is not shorter than 0.001 second and not longer than 1 second.

The optimum period of one cycle of the relative movement of the screen and the substrate is determined mainly depending upon the viscosity of the print material. It is, however, preferred that the lower limit of the period be 0.001 second, 0.002 second, 0.005 second, or 0.01 second and the upper limit of the period be 1 second, 0.4 second, or 0.1 second.

(14) According to a fourteenth feature of the present invention that includes any one of the first to thirteenth features (1) to (13), the moving step comprises moving the at least one of the screen and the substrate relative to the other of the screen and the substrate, and simultaneously vibrating at least one of the screen and the substrate at a period shorter than a period of the one cycle.

This feature promotes producing a clearance between a print pattern and an inner surface of a through-hole.

(15) According to a fifteenth feature of the present invention that includes the fourteenth feature (14), the vibrating step comprises vibrating the at least one of the screen and the substrate at a supersonic frequency.

(16) According to a sixteenth feature of the present invention that includes any one of the first to fifteenth features (1) to (15), the moving step comprises moving, with an actuator which is for correcting at least one positional error between the screen and the substrate in the at least one direction parallel to the print surface of the substrate, the at least one of the screen and the substrate relative to the other of the screen and the substrate.

Since the positional error between the screen and the substrate is corrected, the print material is accurately printed on a print position on the substrate. The actuator for correcting a small positional error between the screen and the substrate can be used to move, by a small distance, one of the screen and the substrate relative to the other of the screen and the substrate. According to this feature, the actuator can be used for not only correcting the position and but producing the clearances. Thus, the clearances can be produced with ease and at low cost.

(17) According to a seventeenth feature of the present invention that includes the sixteenth feature (16), the actuator comprises an electric motor which is controllable with respect to an angle of rotation thereof.

The electric motor according to this feature may be a servomotor or a stepper motor. According to this feature, the distance or speed of relative movement of the screen and the substrate can be easily controlled, and a clearance having a desired dimension can be easily produced.

(18) According to an eighteenth feature of the present invention, there is provided a screen printing apparatus, comprising a screen holding device which holds a screen having a plurality of through-holes; a substrate holding device which holds a substrate; a first moving device which moves at least one of the screen and the substrate toward, and away from, the other of the screen and the substrate, so that the screen and the substrate are contacted with, and separated from, each other; a filling device which fills, in a state in which the screen is contacted with a print surface of the substrate, the through-holes with a print material and thereby prints the print material on the print surface of the substrate; a second moving device which moves, in the state in which the screen is contacted with the substrate, at least one of the screen holding device and the substrate holding device relative to the other of the screen holding device and the substrate holding device, on a plane parallel to the print surface of the substrate, in at least one direction parallel to at least one straight line; and a control device which controls the first moving device, the filling device, and the second moving device, the control device comprising a clearance-produce control portion which controls the second moving device to move at least one of the screen and the substrate relative to the other of the screen and the substrate, in at least one cycle, and thereby produce respective clearances between respective inner surfaces of the through-holes of the screen and the print material printed on the print surface of the substrate.

The present screen-printing apparatus may employ one or more of the above-described second to seventeenth features (2) to (17).

The present screen-printing apparatus can enjoy one or more of the advantages of the screen-printing method according to the first feature (1).

(19) According to a nineteenth feature of the present invention that includes the eighteenth feature (18), the screen-printing apparatus further comprises a positional-error detecting device which detects at least one positional error between the screen and the substrate in the at least one direction parallel to the print surface of the substrate, and the control device further comprises a position-correct control portion which controls, based on the positional error detected by the positional-error detecting device, the second moving device to reduce the detected positional error.

It is preferred that the second moving device be one which can be controlled by the position-correct control portion to reduce the positional error between the screen and the substrate, to substantially zero. However, this is not essentially required. That is, the second moving device may be one which can at least partly reduce the positional error.

The present screen-printing apparatus can enjoy the advantages of the screen-printing method according to the sixteenth feature (16).

BRIEF DESCRIPTION OF THE DRAWINGS

The above and optional objects, features, and advantages of the present invention will be better understood by reading the following detailed description of preferred embodiments of the invention when considered in conjunction with the accompanying drawings, in which:

FIG. 19 is a plan view of a screen, a screen frame, and a screen-frame moving device of another screen-printing apparatus as a fourth embodiment of the present invention.

DETAILED DESCRIPTION OF PREFERRED EMBODIMENTS

Figure 1:
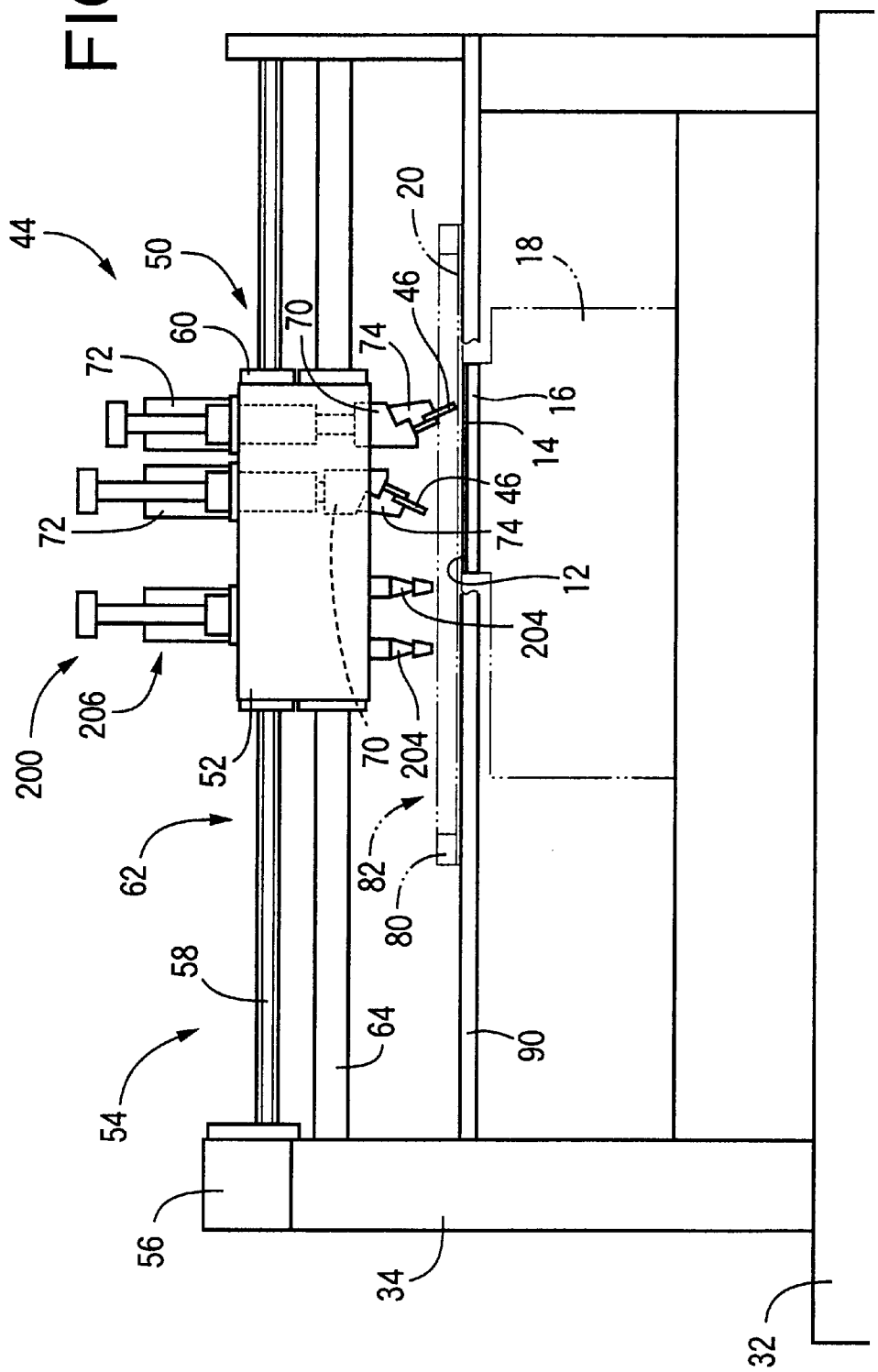
FIG. 1 is a schematic front elevation view of a screen-printing apparatus to which the present invention is applied.

Referring first to FIGS. 1 to 4, 5A, and 5B, there will be described a screen printing apparatus to which the present invention is applied, and which carries out a screen printing method to which the present invention is also applied.

A board conveying device 10 (FIG. 13) conveys, to the present screen printing apparatus, a printed wiring board 14 as a substrate. The board conveying device 10 has a construction similar to that of a board conveying device disclosed in, e.g., Japanese Patent Application laid open for opposition under Publication No. 2-13475. More specifically, the board conveying device 10 includes a pair of rails whose width is adjustable, a pair of endless wound-on members which are wound on the respective rails, and a wound-on-member drive device which drives or moves the wound-on members. When the wound-on-member drive device moves the wound-on members, the printed wiring board 14 is conveyed in such a manner that a print surface 12 of the wiring board 14 on which a creamed solder as a print material is to be printed by the screen printing apparatus faces upward, and the wiring board 14 takes a horizontal posture.

The printed wiring board 14 is positioned, and is horizontally supported, by a board supporting device 16 and, in that state, is elevated and lowered by a board elevating and lowering device 18, so that the print surface 12 of the wiring board 14 is contacted with, and separated from, a screen 20. The board supporting device 16, not shown in detail, supports, like, e.g., a board supporting device disclosed in the above-indicated Japanese Patent Document No. 2-13475, the wiring board 14 by applying a negative pressure or suction thereto. In the present embodiment, the board supporting device 16 provides a printed-wiring-board holding device as a sort of substrate holding device. When the board supporting device 16 applies the negative pressure to the wiring board 14, the wiring board 14 is held down by a board hold-down plate (not shown).

A squeegee device 44 as a filling device is supported by a main frame 34 which is provided on a bed 32 of the screen printing apparatus. The squeegee device 44 includes two squeegees 46 and a squeegee moving device 50 which moves the squeegees 46 relative to the printed wiring board 14 and the screen 20. The squeegee moving device 50 includes a movable member 52 and a movable-member moving device 54. The movable-member moving device 54 includes a servomotor 56 as a sort of electric motor as a drive source, and a motion converting device 62 which includes a feed screw 58 and a nut 60 and converts the rotation of the servomotor 56 into a linear movement of the movable member 52. Thus, the movable member 52 is moved by the moving device 54, while being guided by a guide rod 64 as a guide member.

The movable member 52 supports two elevator members 70 such that each of the elevator members 70 can be elevated and lowered, and two elevating and lowering devices 72 which elevate and lower the respective elevator members 70, independent of each other, relative to the movable member 52. A squeegee holder 74 which holds one squeegee 46 is detachably attached to each of the two elevator members 70. When the elevator members 70 are elevated and lowered, the squeegees 46 are alternately contacted with, and separated from, the screen 20. In addition, each squeegee 46 is moved on the screen 20 when the movable member 52 is moved by the movable-member moving device 54. Thus, the two elevator members 70 and the two elevating and lowering devices 72 provide two squeegee contacting and separating devices which move the two squeegees 46 relative to the screen 20 so that the two squeegees 46 are alternately contacted with, and separated from, the screen 20. In the present embodiment, the squeegees 46 are moved in directions parallel to a direction in which the printed wiring board 14 is conveyed. Hereinafter, a print direction as the squeegee-move direction, i.e., the board-convey direction is referred to as an X-axis direction, and a direction perpendicular to the X-axis direction on a horizontal plane is referred to as a Y-axis direction.

Figure 3:
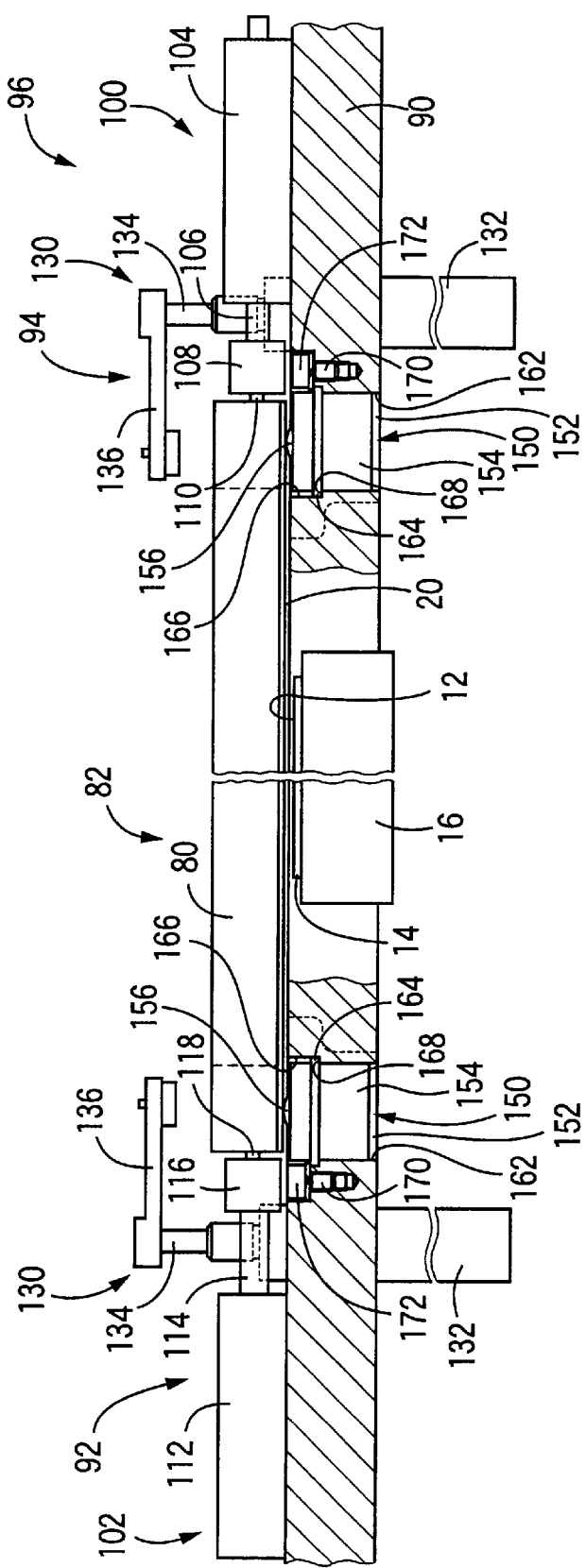
FIG. 3 is a cross-sectioned, front elevation view of the screen-printing apparatus, taken along a vertical plane passing through ball units of the apparatus.
Figure 6:
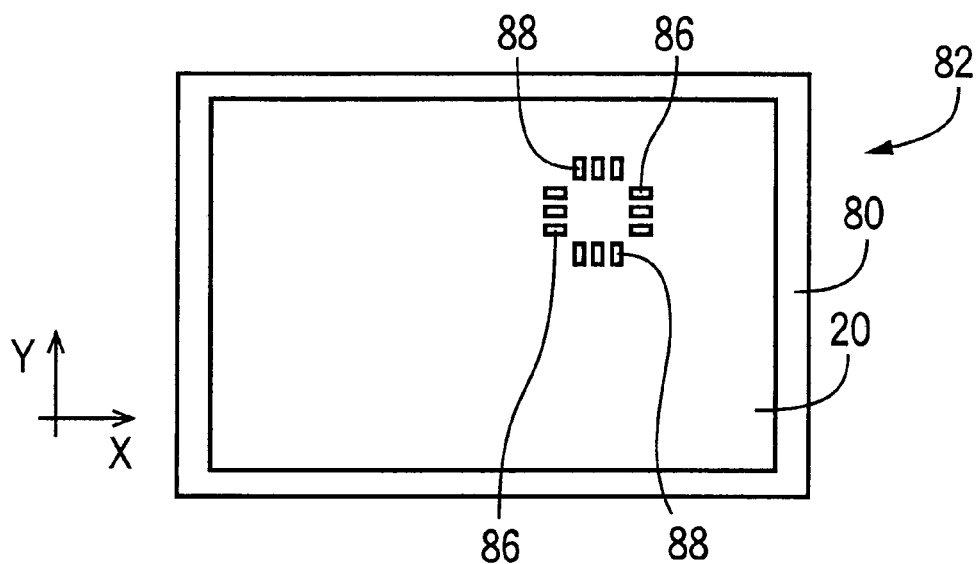
FIG. 6 is a plan view of a screen and a screen frame of the screen-printing apparatus.
Figure 7:
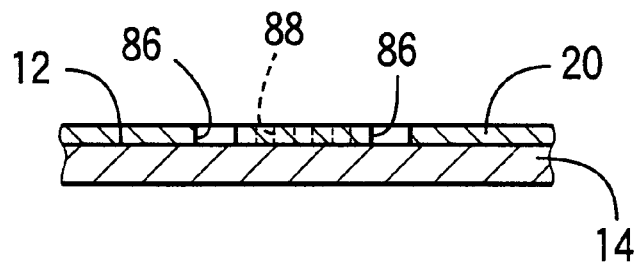
FIG. 7 is a cross-sectioned, front elevation view of the screen and a printed wiring board.

In the present embodiment, the screen 20 has a constant thickness, and is fixed, as shown in FIGS. 3 and 6, to a screen frame 80, such that the screen 20 is free of slack and has a necessary tension and such that the screen 20 covers a lower surface of the screen frame 80. The screen 20 is detachably attached to the main frame 34, as described later. In the present embodiment, the screen frame 80 provides a screen holding device, and the screen 20 and the screen frame 80 cooperate with each other to provide a screen plate 82. As shown in FIGS. 6 and 7, the screen 20 has a plurality of sorts of through-holes, including a plurality of through-holes 86 and a plurality of through-holes 88, which are formed through the thickness of the screen 20 at respective positions corresponding to a plurality of print spots on the printed wiring board 14 where the creamed solder as the print material is to be printed. In the present embodiment, the through-holes 86 are rectangular holes which are elongate in a direction parallel to the X-axis direction, and the through-holes 88 are rectangular holes which are elongate in a direction parallel to the Y-axis direction. The through-holes 86 and the through-holes 88 are differently oriented, but have the same shape and dimensions.

In the present embodiment, the printed wiring board 14 is horizontally supported by the board supporting device 16, such that the print surface 12 of the wiring board 14 is parallel to the horizontal plane. Providing that a first straight line is parallel to the X-axis direction and a second straight line is parallel to the Y-axis direction perpendicular to the X-axis direction on the horizontal plane, the first and second straight lines are parallel to the print surface 12 of the wiring board 14 and are perpendicular to each other. Hereinafter, the through-holes 86 are referred to as the first elongate holes which are elongate in a direction parallel to the first straight line, and the through-holes 88 are referred to as the second elongate holes which are elongate in a direction parallel to the second straight line, if appropriate.

Figure 2:
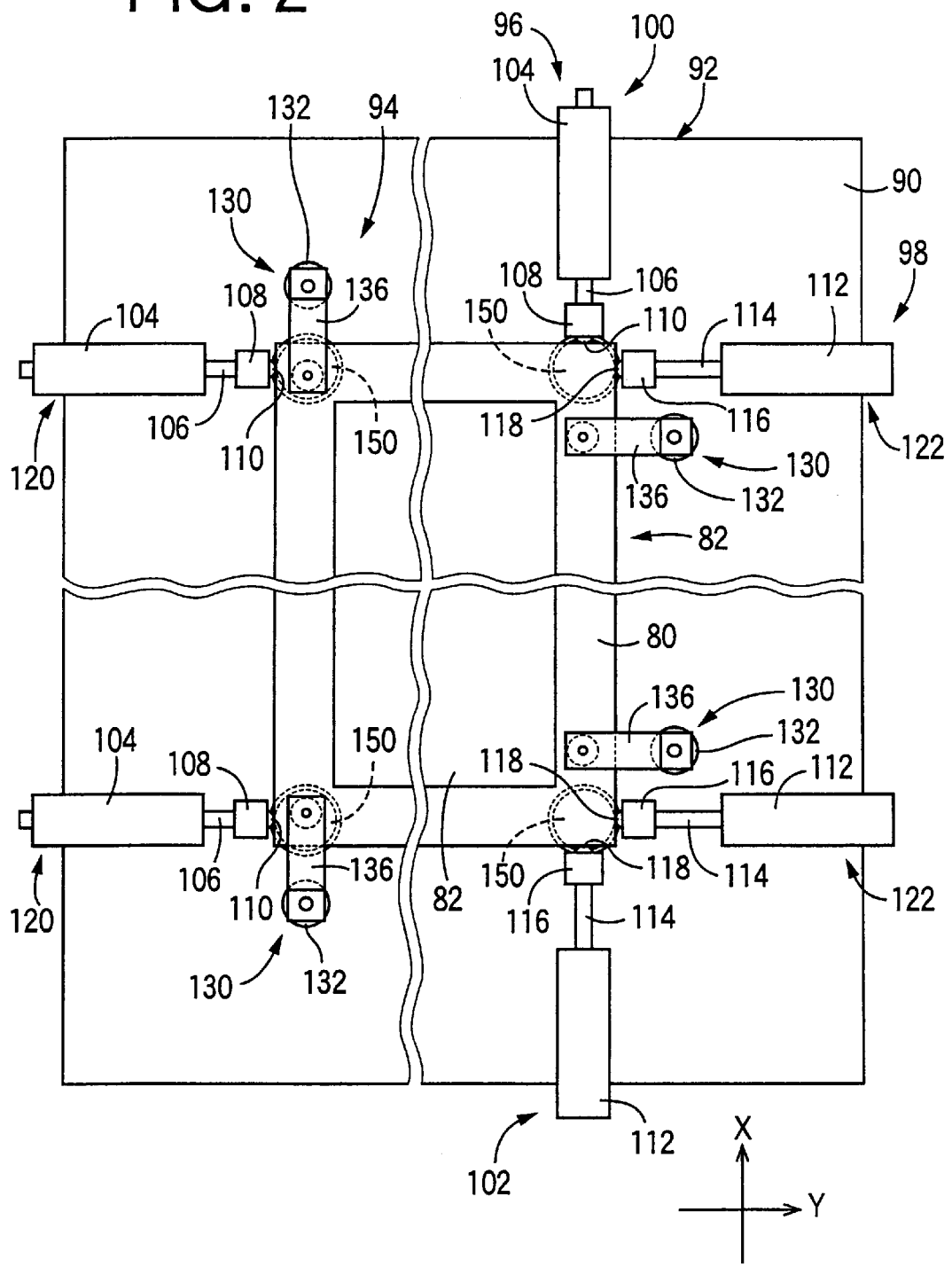
FIG. 2 is a plan view of a screen-frame moving device and a fixing device of the screen-printing apparatus.

As shown in FIG. 1, the screen plate 82 is detachably attached to a frame-support table 90 supported by the main frame 34, such that the screen frame 80 is supported on the frame-support table 90. The frame-support table 90 has a rectangular shape with a rectangular central window through which the printed wiring board 14 is contacted with, and separated from, the screen 20 of the screen plate 82 attached to the frame-support table 90. In this state, the screen 20 extends along the horizontal plane. As shown in FIG. 2, the frame-support table 90 is provided with a screen-frame moving device 92, and a fixing device 94. In the present embodiment, the screen-frame moving device 92 moves the screen frame 80 relative to the frame-support table 90, for the purposes of correcting positional errors of the screen 20 relative to the wiring board 14 and producing respective clearances between respective inner surfaces of the through-holes 86, 88 and respective outer surfaces of print patterns printed on the wiring board 14. To this end, the screen moving device 92 includes a pushing-utilizing X-axis-direction position correcting device 96 which corrects a position of the screen 20 relative to the frame-support table 90 or the wiring board 14 in the X-axis direction; and a pushing-utilizing Y-axis-direction position correcting device 98 which corrects a position of the screen 20 relative to the table 90 or the board 14 in the Y-axis direction.

The pushing-utilizing X-axis-direction position correcting device 96 includes an X-axis-direction position correcting device 100 and an X-axis-direction pushing device 102. The X-axis-direction position correcting device 100 includes a position correcting electrically operated cylinder 104. The electric cylinder 104 extends parallel to the X-axis direction. In the present embodiment, the electric cylinder 104 includes a housing; a nut (not shown) which is provided in the housing such that the nut is rotatable about its axis line but is not movable in its axial direction; a ball screw 106 which is screwed in, and engaged with, the nut and which is movable in its axial direction but is not rotatable relative to the housing; and a servomotor 107 (FIG. 13) as a sort of electric motor as a drive source that rotates the nut. When the nut is rotated by the servomotor 107, the ball screw 106 is advanced and retracted in opposite directions parallel to the X-axis direction. The servomotor 107 is an electric motor which can be controlled with high accuracy with respect to rotation angle.

A head 108 is provided at one of opposite ends of the ball screw 106 that project from the housing of the electric cylinder 104. The head 108 supports a roller 110 such that the roller 110 is rotatable about its vertical axis line (i.e., axis line perpendicular to the plane of the frame-support table 90), and such that a radially outer portion of the roller 110 partly projects from the head 108. When the ball screw 106 is advanced or retracted by the servomotor 107, the head 108 is automatically moved to a position where the head 108 positions the screen 20 in the X-axis direction. Thus, the position of the screen 20 relative to the frame-support table 90 in the X-axis direction is corrected.

The X-axis-direction pushing device 102 includes a pushing cylinder 112 which is opposed to the X-axis-direction position correcting device 100 in the X direction and which is provided by an air-pressure-operated cylinder. A head 116 is provided at one of opposite ends of a piston rod 114 that projects from a housing of the pushing cylinder 112, and the head 116 supports a roller 118 such that the roller 118 is rotatable about its vertical axis line and such that a radially outer portion of the roller 118 partly projects from the head 116.

The Y-axis-direction pushing-utilizing position correcting device 98 includes two Y-axis-direction position correcting devices 120 and two Y-axis-direction pushing devices 122. Each of the two Y-axis-direction position correcting devices 120 has the same structure as that of the X-axis-direction position correcting device 100, and each of the two Y-axis-direction pushing devices 122 has the same structure as that of the X-axis-direction pushing device 102. The same reference numerals as used for the devices 100, 102 are used to designate corresponding elements or parts of the devices 120, 122, and the description thereof is omitted. The two Y-axis-direction position correcting devices 120 are provided on the frame-support table 90 at respective places distant from each other in the X-axis direction, and the two Y-axis-direction pushing devices 122 are also provided on the frame-support table 90 at respective places distant from each other in the X-axis direction, such that the two pushing devices 122 are opposed to the two position correcting devices 120, respectively, in the Y-axis direction.

The fixing device 94 includes four clamp units 130 which are provided on the frame-support table 90 at respective positions corresponding to the four corners of the screen frame 80. Since the four clamp units 130 have a same structure, one of the four units 130 will be described below as a representative thereof. One clamp unit 130 includes a clamping cylinder 132 which is oriented in a vertical direction perpendicular to the plane of the frame-support table 90 and which is provided, in the present embodiment, by an air-pressure-operated cylinder. As shown in FIG. 3, an axis member 134 is attached to a piston rod of the clamping cylinder 132, and a clamp arm 136 extends from one end of the axis member 134 in a direction perpendicular to an axis line of the axis member 134.

When the piston rod of the clamping cylinder 132 is advanced and retracted, the axis member 134 is advanced and retracted, and rotated. More specifically described, when the piston rod is advanced or retracted over a predetermined portion of its entire stroke, the arm axis 134 is rotated about its axis line. The axis member 134 has a cam groove formed in an outer circumferential surface thereof. The cam groove includes a straight portion extending parallel to the axis line of the axis member 134, that is, extending in the axial direction of the axis member 134, and an inclined portion extending with an inclination with respect to the axis line. A pin as a cam follower is fitted in a hole formed in a guide member which guides the axial-direction movement and rotation of the axis member 134. Therefore, when the piston rod is advanced or retracted and accordingly the axis member 134 is advanced or retracted, the pin is moved in the cam groove (in fact, the cam groove is moved relative to the pin). While the pin is moved in the straight portion of the cam groove, the axis member 134 is moved in its axial direction but is not rotated about its axis line; and while the pin is moved in the inclined portion, the axis member 134 is moved in its axial direction while being rotated.

Figure 5A:
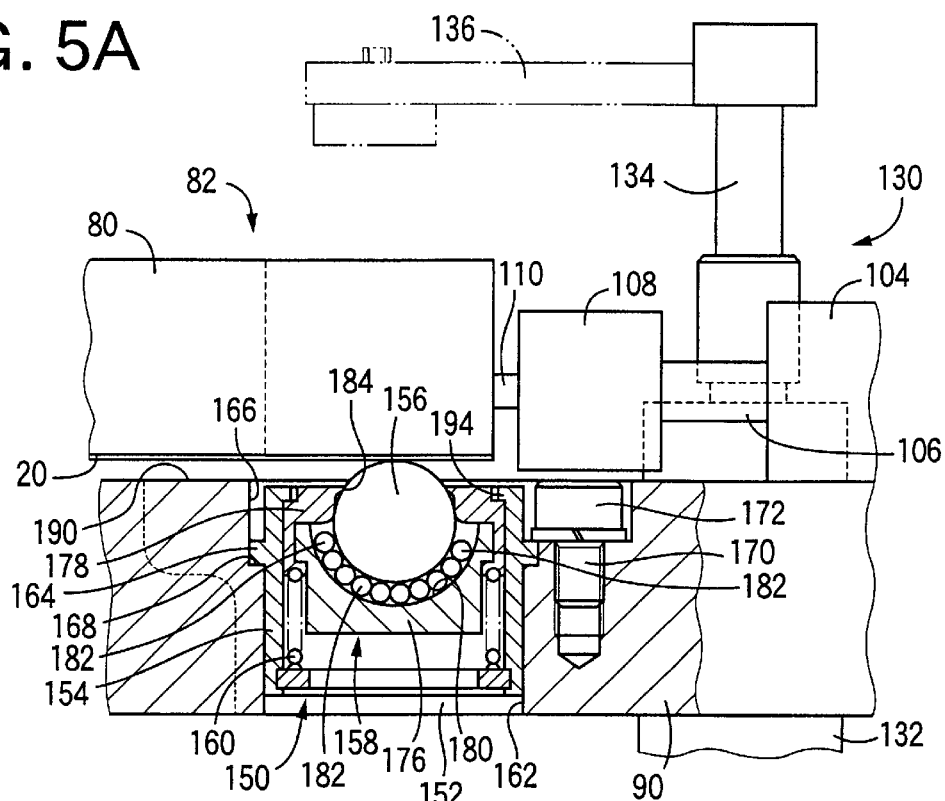
FIG. 5A is a cross-sectioned, front elevation view of one of the ball units, showing a ball at its advanced position.
Figure 5B:
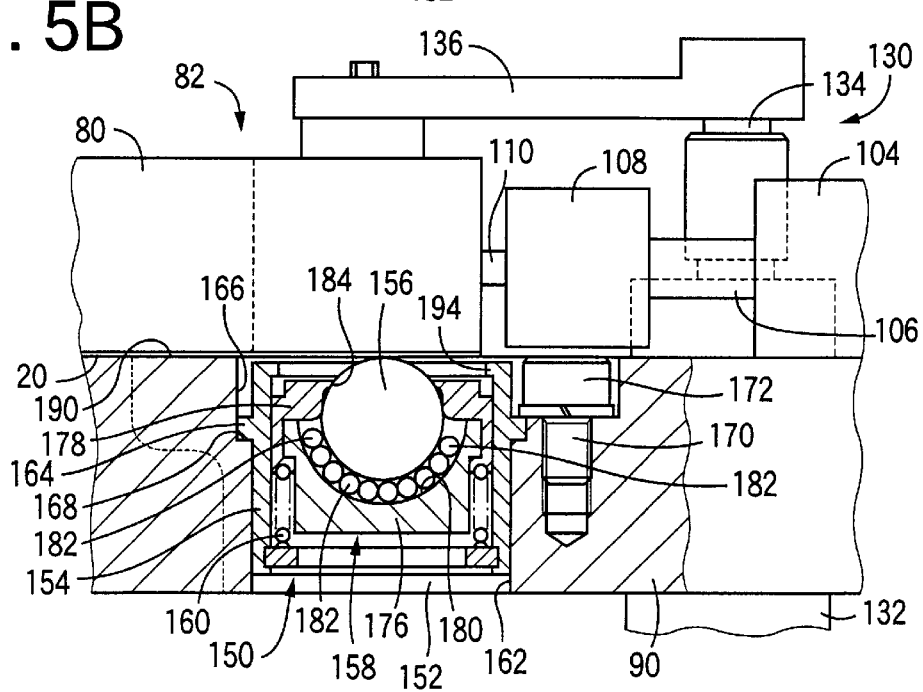
FIG. 5B is a cross-sectioned, front elevation view of the one ball unit of FIG. 5A, showing the ball at its retracted position.

The axis member 134 is advanced and rotated to its advanced-end position, shown in FIG. 5A, where the axis member 134 takes a first predetermined rotation position, and is retracted and rotated to its retracted-end position, shown in FIG. 5B, where the axis member 134 takes a second predetermined rotation position. When the axis member 134 is advanced or retracted and/or rotated, the clamp arm 136 is also advanced or retracted parallel to the axis line of the axis member 134, and/or rotated about that axis line. The clamp arm 136 is advanced and rotated to its permitting position, shown in FIG. 5A, where the clamp arm 136 is separate from the screen frame 80 in a direction parallel to the direction of thickness of the same 80 and permits the screen plate 82 to be moved relative to the frame-support table 90, and is retracted and rotated to its fixing position, shown in FIG. 5B, where the clamp arm 136 presses the screen frame 80 against the frame-support table 90, thereby fixing the frame 80 to the table 90. The fixing position of the clamp arm 136 can be said as its operative position above the screen frame 80, and the permitting position of the same 136 can be said as its inoperative position away from the screen frame 80. When the axis member 134 takes its advanced-end position, the axis member 134 takes its first rotation position. In this state, the clamp arm 136 takes its permitting position and its inoperative position. Meanwhile, when the axis member 134 takes its retracted-end position, the axis member 134 takes its second rotation position. In this state, the clamp arm 136 takes its fixing position and its operative position. The cam groove formed in the axis member 134 is designed such that when the axis member 134 is retracted from its advanced-end position, the axis member 134 is rotated during an initial period following the beginning of retraction, so that the clamp arm 136 is rotated from its inoperative position to its operative position while being moved from its permitting position to its fixing position, and so that the clamp arm 136 reaches its operative position before contacting the screen frame 80, then contacts the screen frame 80 after having stopped rotating, and further approaches the frame-support table 90. On the contrary, when the axis member 134 is advanced from its retracted-end position toward its advanced-end position, the axis member 134 is not rotated but is moved from its fixing position toward its permitting position away from the screen frame 80, during an initial period following the beginning of advancement. Then, the clamp arm 136 is rotated from its operative position to its inoperative position while being moved away from the screen frame 80. However, FIG. 3 illustrates, for just showing the shape of the clamp arm 136, that the clamp arm 136 is taking its permitting position and simultaneously taking its operative position.

As shown in FIG. 2, the frame-support table 90 is provided with four ball units 150 at respective positions corresponding to the four corners of the screen frame 80. Since the four ball units 150 has a same structure, one of the four units 150 will be described below as a representative thereof.

Figure 4:
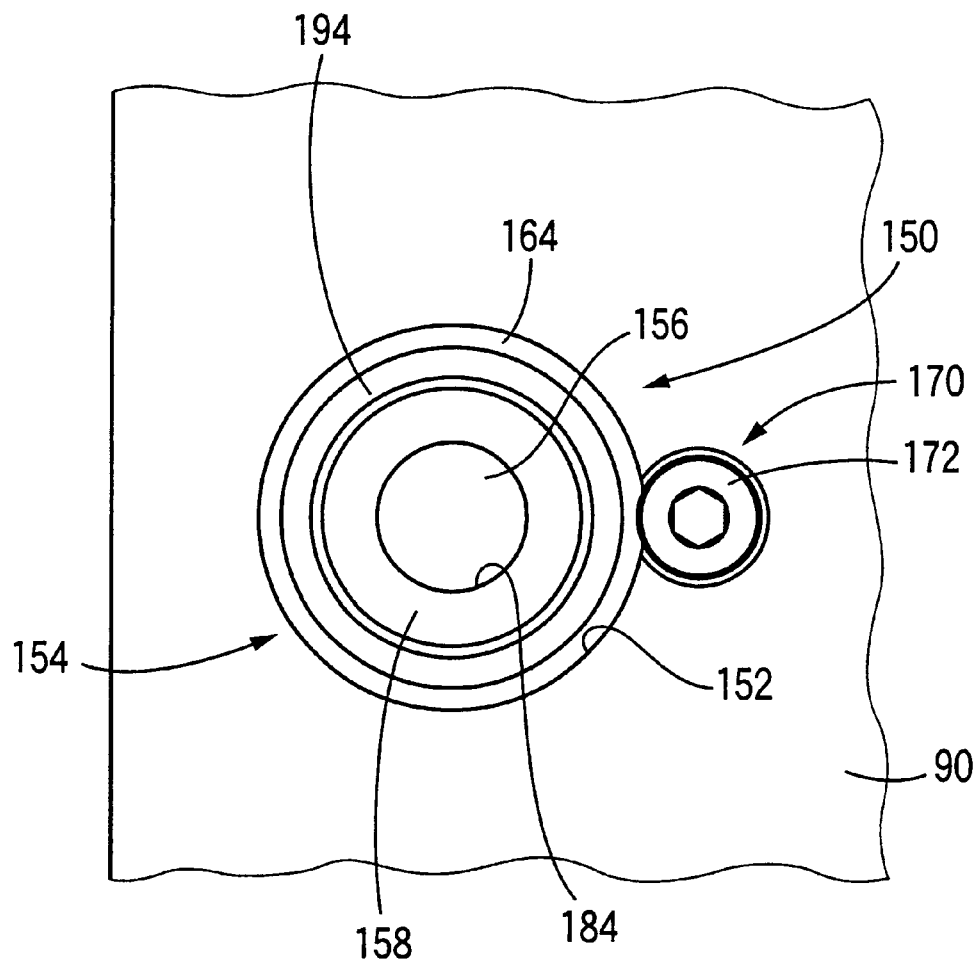
FIG. 4 is a plan view of one of the ball units.

The frame-support table 90 has four unit-hold holes 152 at respective positions corresponding to the four corners of the screen frame 80. Each of the four unit-hold holes 152 has a circular cross section and is formed through the thickness of the table 90. Two holes 152 out of the four holes 152 are shown in FIG. 3. The four ball units 150 are fitted in, and held by, the four unit-hold holes 152, respectively. As shown in FIGS. 4 and 5, each one of the ball units 150 includes a cylindrical unit case 154, and a ball 156, a ball case 158, and a compression coil spring 160 (hereinafter, simply referred to as the spring 160) as an elastic member which are assembled in the unit case 154. Each one of the four unit-hold holes 152 has a stepped shape, i.e., includes a small-diameter portion 162 and a large-diameter portion 166. The unit case 154 is fitted in the small-diameter portion 162, such that a flange 164 extending radially outwardly from an axially intermediate portion of the unit case 154 is supported on a bottom surface 168 of the large-diameter portion 166. The flange 164 is provided at a position somewhat higher than the axially middle portion of the unit case 154. The ball unit 150 is fastened by a screw 170 which is screwed in the frame-support table 90, such that the flange 164 of the unit case 154 is sandwiched between a head portion 172 of the screw 170 and the bottom surface 168 of the large-diameter portion 166. Thus, the unit case 154 or the ball unit 150 is prevented from coming off the unit-hold hole 152.

The ball case 158 is easily manufactured by assembling a first member 176 and a second member 178 into the integral member, i.e., the integral ball case 158. As shown in FIG. 4, the ball case 158 has a circular cross section. The ball case 158 is accommodated in the unit case 154 such that the ball case 158 is slideable on an inner circumferential surface of the unit case 154. The ball case 158 has a semi-spherical concave bottom surface 180 which supports the ball 156, via a number of small round members 182 whose diameter is smaller than that of the ball 156, such that the ball 156 is rollable. As shown in FIGS. 4 and 5, the ball case 158 has an opening 184 which is defined by a portion of a semi-spherical concave surface. The ball case 158 retains the ball 156 such that a portion of the ball 156 projects into an outside space through the opening 184 but is not separable from the ball case 158. The ball 156 is held in contact with the concave surface defining the opening 184, such that the ball 156 is rollable.

The spring 160 is provided between the ball case 158 and the unit case 154, and biases the ball case 158 toward the screen frame 80, thereby biasing the ball 156 toward its advanced position. The limit of movement of the ball case 158 caused by a biasing force of the spring 160 is defined by butting of the ball case 158 against an inner flange 194 projecting radially inwardly from one of axially opposite ends of the unit case 154 that is nearer to the screen frame 80. Thus, the advanced position of the ball 156 is defined such that the ball 156 held at its advanced position projects upwardly and intersects a plane passing through a flat frame-support surface 190 of the frame-support table 90 that supports the screen frame 80 via the screen 20. The four balls 156 held at their advanced positions cooperate with one another to position the screen frame 80 at a position apart by a predetermined distance from the frame-support surface 190. In the state in which the ball case 158 is held in butting contact with the inner flange 194 of the unit case 154 and the ball 156 is held at its advanced position, the spring 160 is kept in a compressed state in which the spring 160 can bear a preset load somewhat greater than a load which is applied by the screen plate 82 to the ball 156. Meanwhile, the retracted position of the ball 156 is defined such that the upper end of the ball 156 held at its retracted position is positioned on the plane passing through the frame-support surface 190, that is, is aligned with the surface 190, and accordingly such that the ball 156 held at its retracted position permits the screen frame 80 to contact the frame-support surface 190 via the screen 20.

Figure 8:
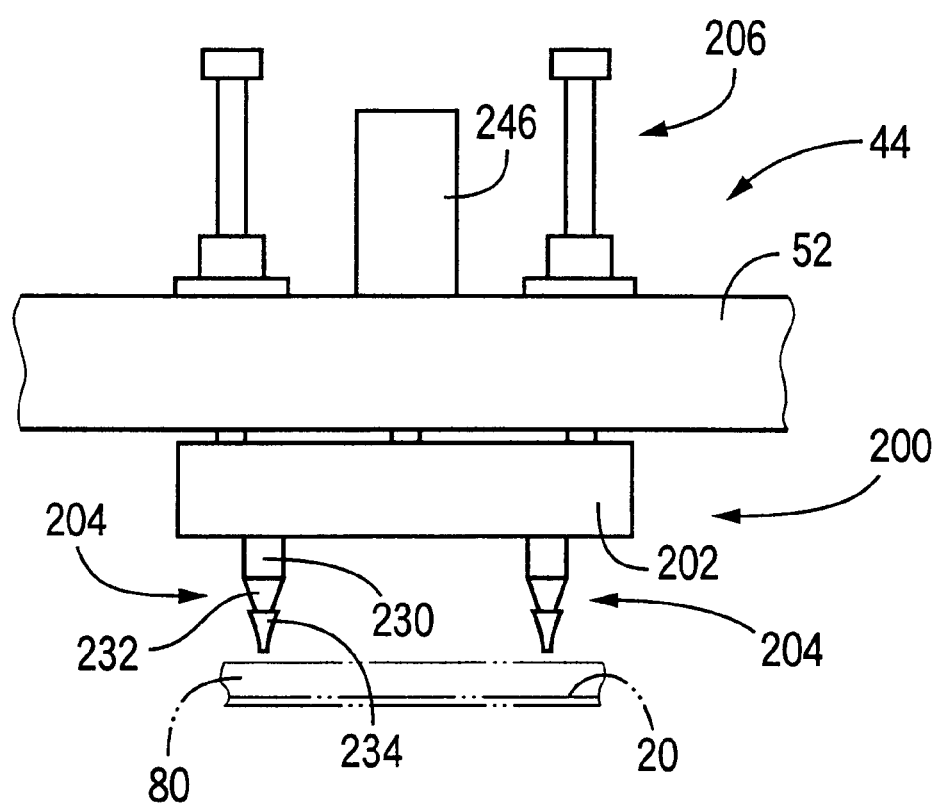
FIG. 8 is a side elevation view of a screen-vibrating device of the screen-printing apparatus.

The screen-printing apparatus additionally includes, as shown in FIGS. 1 and 8, a screen-vibrating device 200 as a vibrating device. The screen-vibrating device 200 includes a base member 202 and a plurality of supersonic-vibration heads 204 each of which is attached to the base member 202 such that a position of the each head 204 is adjustable. In the present embodiment, the base member 202 has a plate-like configuration, and is attached to the movable member 52 of the squeegee device 44 such that the base member 202 can be elevated and lowered by an elevating and lowering device 206. FIG. 1 shows two supersonic-vibration heads 204 as representatives of all the heads 204.

Figure 9:
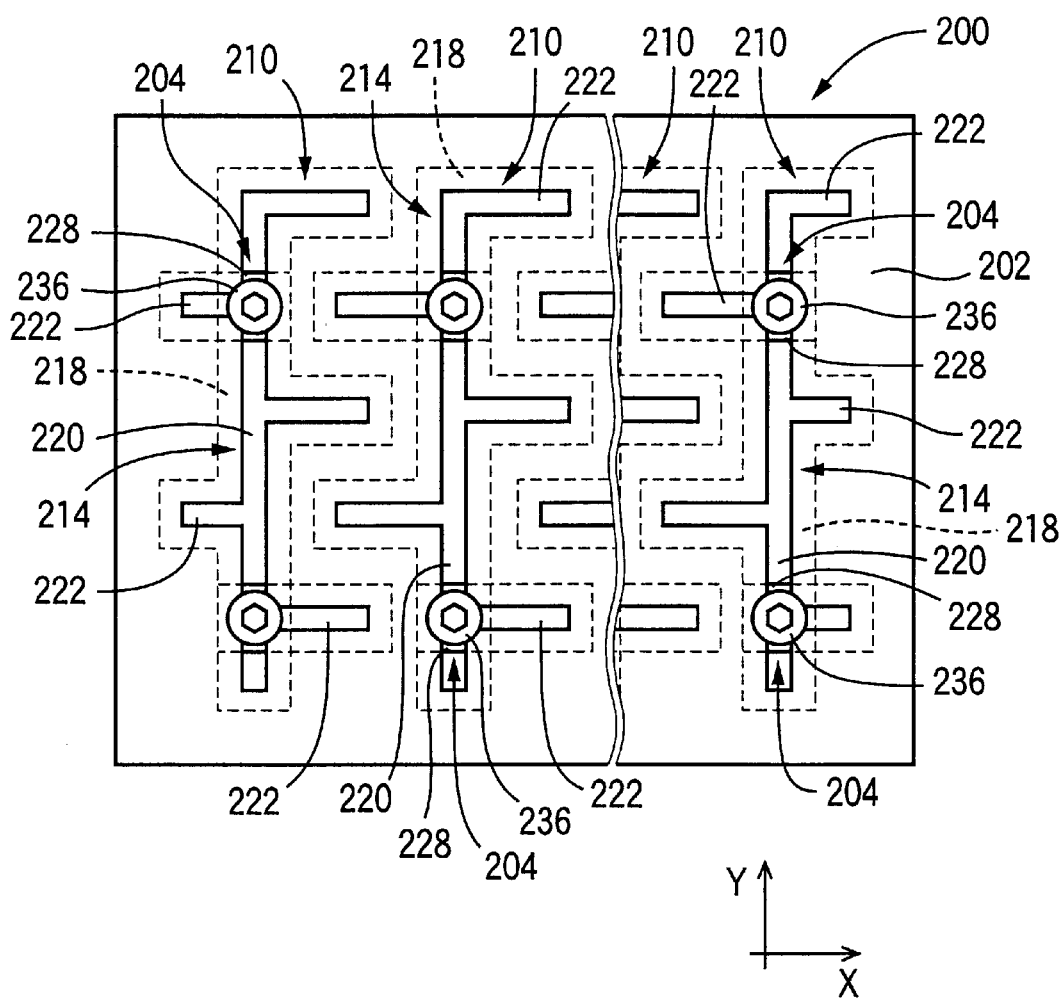
FIG. 9 is a plan view of a base member and a supersonic-vibration head of the screen-vibrating device.
Figure 10:
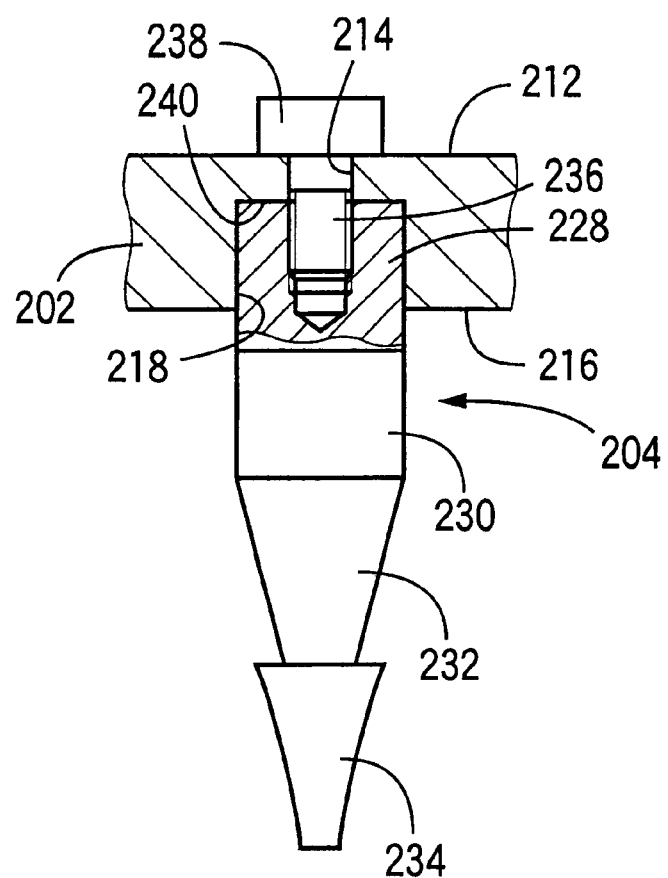
FIG. 10 is a partly cross-sectioned, front elevation view of the supersonic-vibration head.

The base member 202 has a plurality of grooves 210. As shown in FIGS. 9 and 10, each groove 210 has an inverted-T-shaped cross section, that is, includes an upper portion 214 which opens in an upper surface 212 of the base member 202 and has a width smaller than that of a lower portion 218 which opens in a lower surface 216 of the base member 202. In addition, each groove 210 includes a Y-axis-direction portion 220 extending in the Y-axis direction, and a plurality of X-axis-direction portions 222 which extend in the X-axis direction from the Y-axis-direction portion 220, alternately in a forward and a backward direction. The X-axis-direction portions 222 of one groove 210 are alternate with those 222 of another groove 210 adjacent to the one groove 210.

As shown in FIG. 10, each supersonic-vibration head 204 includes a fitting portion 228 which has a square cross section and is fitted in the lower portion 218 of one groove 210; a magnetostrictive vibrator 230 attached to a lower surface of the fitting portion 228; a cone member 232; and a horn member 234. A plurality of heads 204 are attached to each groove 210. A bolt 236 is screwed in the fitting portion 228 of each head 204, such that a head portion of the bolt 236 projects upward from the upper portion 214 of the groove 210.

Since the head portion 238 of the bolt 236 of each supersonic-vibration head 204 is engaged with the upper surface 212 of the base member 202, the each head 204 is prevented from falling off the base member 202; and since the fitting portion 228 is engaged with inner surfaces of the lower portion 218 of one groove 210, the each head 204 is prevented from being rotated. When the bolt 236 is screwed into the fitting portion 228, the fitting portion 228 is pressed against a shoulder surface 240 of the groove 210, so that the fitting portion 228 cooperates with the head portion 238 to pinch a portion of the base member 202 that defines the upper portion 214 of the groove 210 and thereby fix the each head 204 to the base member 202.

Figure 13:
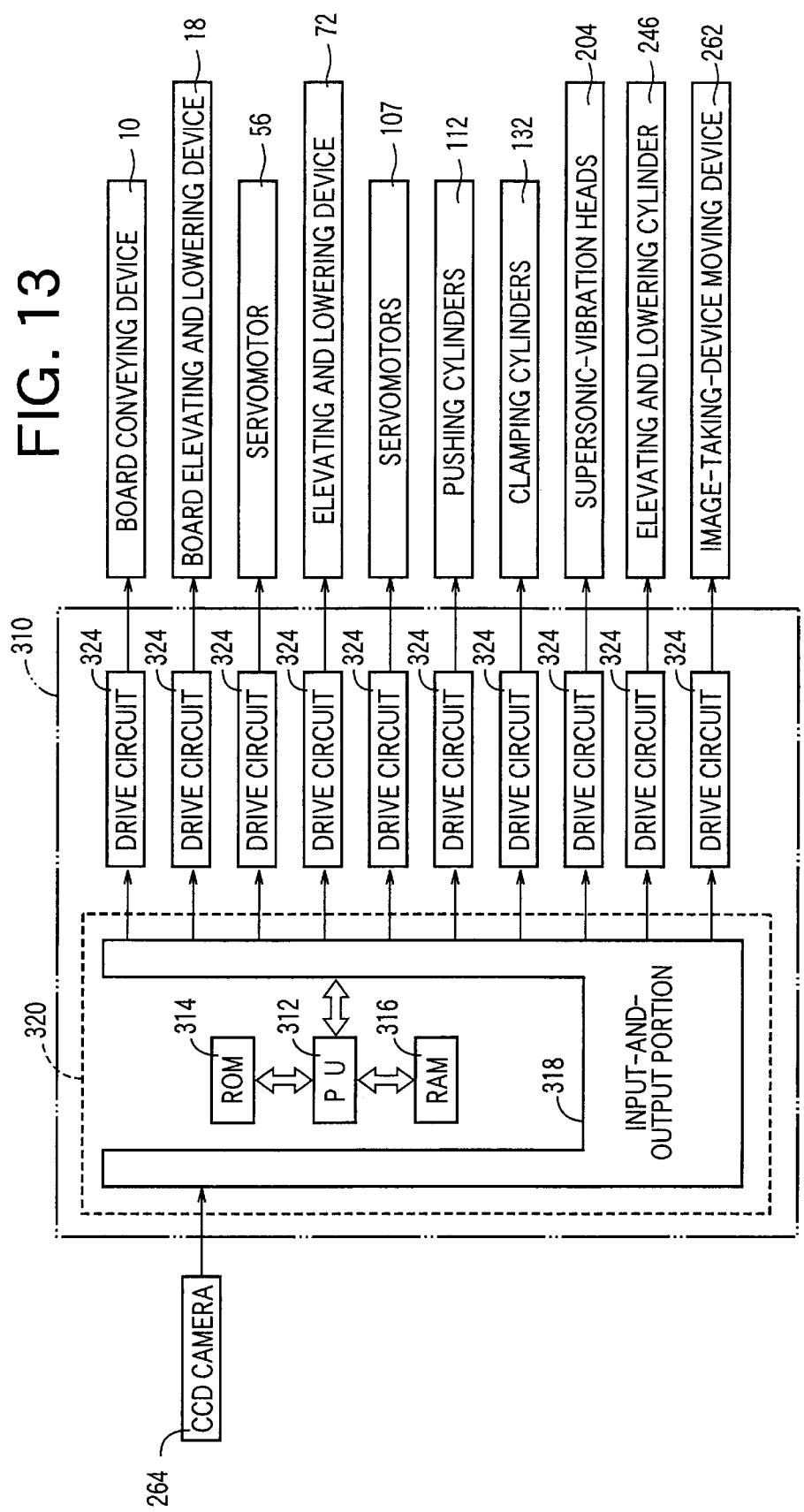
FIG. 13 is a diagrammatic view of a construction of a control device of the screen-printing apparatus.

Therefore, a position of each supersonic-vibration head 204 can be adjusted by an operator by first unfastening the bolt 236, then moving the each head 204 to a desired position in one groove 210, and fastening the bolt 236 and thereby fixing the head 204. The respective positions of the supersonic-vibration head 204 are adjusted, in advance, according to a sort of the screen 20 to be used. The elevating and lowering device 206 includes an elevating and lowering cylinder 246 (FIG. 13). In the present embodiment, the elevating and lowering cylinder 246 is provided by an air cylinder.

Figure 11:
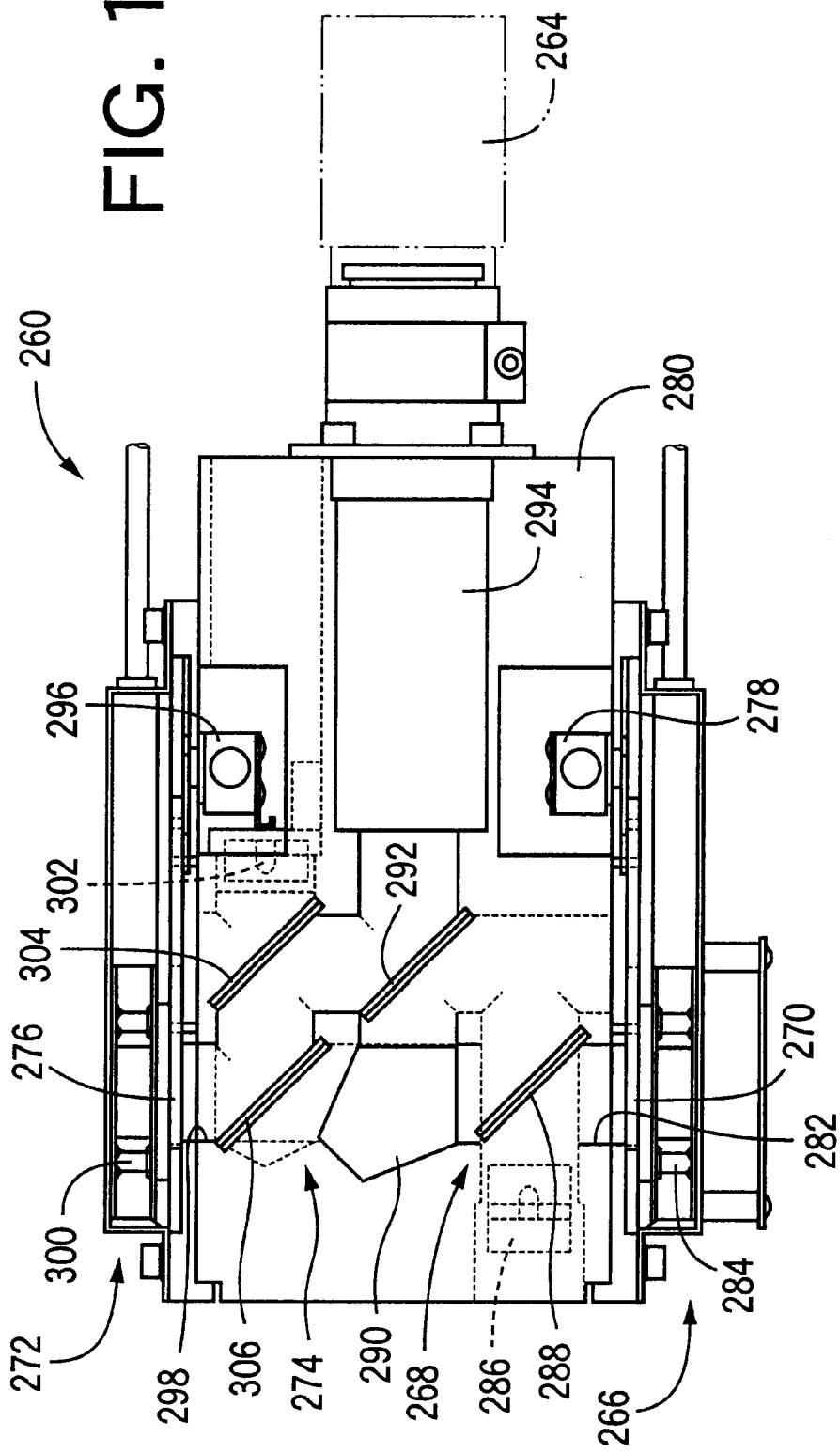
FIG. 11 is a schematic front elevation view of a reference-mark-image taking device which takes respective images of reference marks provided on the screen and the printed wiring board.
Figure 12:
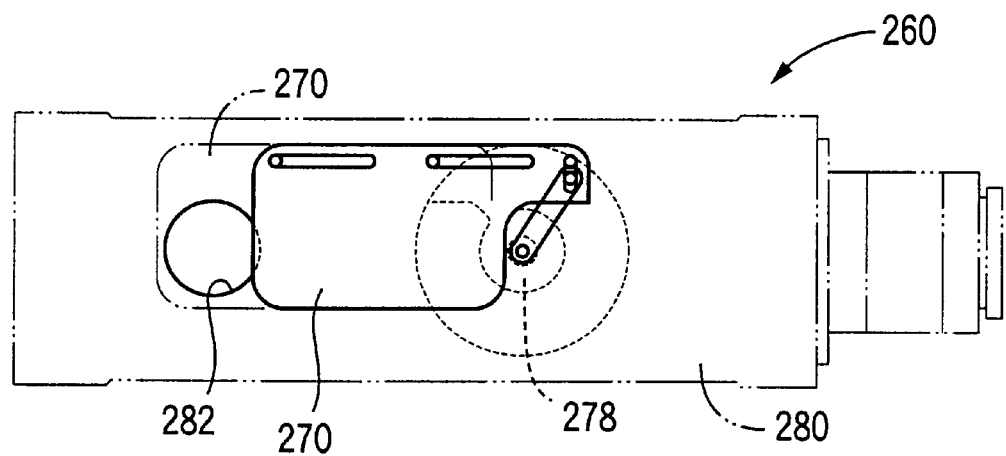
FIG. 12 is a bottom view of a shutter as part of the reference-mark-image taking device.

In addition, the screen-printing apparatus includes a reference-mark-image taking device 260, schematically shown in FIGS. 11 and 12, which takes respective images of a plurality of (in the present embodiment, two) reference marks provided on the printed wiring board 14, and respective images of a plurality of (in the present embodiment, two) reference marks provided on the screen 20. An image-taking-device moving device 262 (FIG. 13) moves the reference-mark-image taking device 260 into a space between the screen 20 fixed to the frame-support table 90 and the printed wiring board 14 being positioned at a retracted position thereof away from the screen 20, and to a desired position on a horizontal plane, so that the image taking device 260 takes respective images of the reference marks of each of the wiring board 14 and the screen 20. In the present embodiment, the two reference marks are diagonally distant from each other on each of the wiring board 14 and the screen 20.

As shown in FIG. 11, the reference-mark-image taking device 260 includes a CCD (charge-coupled device) camera 264, a wiring-board lighting device 266, a wiring-board optical system 268, a wiring-board shutter 270, a screen lighting device 272, a screen optical system 274, and a screen shutter 276. The wiring-board shutter 270 is driven or moved by a shutter drive device 278, to an open position, indicated at solid line in FIG. 12, where the shutter 270 opens an aperture 282 of a casing 280 to permit a light to pass therethrough, and to a closed position, indicated at two-dot chain line, where the shutter 270 closes the aperture 282 to prevent the light from passing therethrough. When the images of the reference marks of the printed wiring board 14 are taken, the wiring-board shutter 270 is opened, while the screen shutter 276 remains closed. In addition, a first lighting device 284 of the wiring-board lighting device 266 emits a light toward the reference marks of the wiring board 14, and a second lighting device 286 of the lighting device 266 emits a light toward a half mirror 288, which reflects the light toward the reference marks of the wiring board 14. The lights reflected from the reference marks pass through the half mirror 288, are inverted by a prism 290, pass through a half mirror 292, and are incident to a lens 294. Thus, images of the reference marks are taken by the CCD camera 264. Since the wiring-board shutter 270 is opened and the screen shutter 276 remains closed, when the images of the reference marks of the wiring board 14 are taken, the CCD camera 264 takes only the images of the reference marks of the wiring board 14. The wiring-board optical system 268 includes the half mirrors 288, 292, the prism 290, and the lens 294.

When the images of the reference marks of the screen 20 are taken, the wiring-board shutter 270 is closed, and the screen shutter 276 is opened, by a shutter drive device 296, to open an aperture 298 of the casing 280. In addition, a first lighting device 300 of the screen lighting device 272 emits a light toward the reference marks of the screen 20, and a second lighting device 302 of the lighting device 272 emits a light toward a half mirror 304, which transmits the light to a mirror 306, which reflects the light toward the reference marks of the screen 20. The lights reflected from the reference marks are reflected by each of the mirror 306, the half mirrors 304, 292, and are incident to the lens 294. Thus, images of the reference marks are taken by the CCD camera 264. The screen optical system 274 includes the mirror 306, the half mirrors 292, 304, and the lens 294.

The present screen-printing apparatus includes a control device 310, shown in FIG. 13. The control device 310 is essentially provided by a computer 320 including a PU (processing unit) 312, a ROM (read only memory) 314, a RAM (random access memory) 316, and an input-and-output portion 318. The CCD camera 264 is connected to the input-and-output portion 318, so that image data representing the images taken by the CCD camera 264 are input to the control device 310. In addition, the input-and-output portion 318 is connected via respective drive circuits 324 to respective actuators of various devices including the board conveying device 10. The computer 320 cooperates with the drive circuits 324 to provide the control device 310. In addition, respective actuators of the various devices of the reference-mark-image taking device 260, including the shutter drive device 278, are also connected to the input-and-output portion 318 via respective drive circuits, although not shown in FIG. 13. Each of the various air cylinders, including the pushing cylinders 112, is a sort of pressurized-fluid-operated cylinder as a pressurized-fluid-operated actuator as a drive source. The ROM 314 of the computer 320 stores various control programs including a program for correcting a position of the screen 20 relative to the printed wiring board 14; a program for performing a screen printing; and a program for moving at least one of the screen 20 and the wiring board 14 relative to the other of the screen 20 and the wiring board 14, when the screen 20 and the wiring board 14 are separated from each other after the printing. The PU 312 carries out those programs by utilizing a temporary-storage function of the RAM 316.

Next, the operation of the screen-printing apparatus will be described.

In the present screen-printing apparatus, before the application of the creamed solder to the printed wiring board 14, a positional error of each of the respective positions of the screen 20 relative to the frame-support table 90 in the X-axis and Y-axis directions each parallel to the screen 82, is corrected, whereby a positional error of each of the respective positions of the screen 20 relative to the printed wiring board 14 in the X-axis and Y-axis directions each parallel to the print surface 12, is corrected. After the positional-error correcting operation, the creamed solder is applied to the wiring board 14 and, after the application, the screen 20 is moved relative to the wiring board 14, so that clearances are produced between the print patterns formed by the creamed solder filled in the through-holes including the through-holes 86, 88, and the through-holes 86, 88. Subsequently, the wiring board 14 is lowered to be separated from the screen 20, and is carried out by the board conveying device 10, while another wiring board 14 to which the creamed solder is to be applied next is carried in.

In the present embodiment, one positional-error correcting operation is carried out for each of the printed wiring boards 14. The movement of the wiring board 14 carried in by the board conveying device 10 to below the squeegee device 44 is stopped by a stopper device, not shown, at a position right above the board supporting device 16. When the wiring board 14 is carried in, the board supporting device 16 is positioned at its lower-end position, and the board hold-down plate is positioned at a position above the board supporting device 16.

After the printed wiring board 14 is carried in, the board supporting device 16 is elevated to lift up the wiring board 14 off the board conveying device 10 and press the same 14 against the board hold-down plate. Simultaneously, positioning pins supported by the rails of the board conveying device 10 are fitted in positioning holes of the wiring board 14, respectively, to position the wiring board 14. In this state, vacuum is supplied to the board supporting device 16 so that the wiring board 14 is sucked by the negative pressure to the supporting device 16 and is fixed to the same 16. Subsequently, the supporting device 16 is lowered by a small distance to be separated from the board hold-down plate, and the hold-down plate is moved away from above the wiring board 14. The above-described carrying-in, positioning, and holding of the wiring board 14 are carried out as those are done by the screen-printing apparatus disclosed in Japanese Patent Document No. 2-13475.

In this state, the reference-mark-image taking device 260 is moved into a space between the printed wiring board 14 supported by the board supporting device 16 and positioned at a position away from the screen 20, and the screen 20 supported by the frame-support table 90, so as to take respective images of two reference marks provided on the wiring board 14 and respective images of two reference marks provided on the screen 20. As will be described later, after the application of the creamed solder to the wiring board 14, the screen frame 80 has been released from the fixation thereof to the frame-support table 90 by the clamping arms 136, so that the screen 20 can be moved relative to the wiring board 14. Therefore, when the images of the reference marks are taken, the screen frame 80 remains released from the frame-support table 90. However, the screen frame 80 remains positioned by the X-axis-direction and Y-axis-direction pushing-utilizing positioning devices 96, 98 on the horizontal plane. Alternatively, it is possible to take the images of the reference marks in a state in which the screen 20 is fixed to the frame-support table 90 by the fixing device 94. In the latter case, after the reference-mark-image taking operation and before the positional-error correcting operation, the screen 20 is released from the fixation thereof to the table 90 by the fixing device 94. Then, based on the reference-mark images taken by the image taking device 260, the control device 310 calculates respective positional errors of the screen 20 relative to the wiring board 14 in the X-axis and Y-axis directions parallel to the print surface 12, and then calculates respective positions of the screen 20 in the X-axis and Y-axis directions, where the screen 20 is fixed to the table 90 without any positional errors of the screen 20 relative to the wiring board 14 in the X-axis and Y-axis directions, that is, the X-axis-direction pushing-utilizing position correcting device 100 and the two Y-axis-direction pushing-utilizing position correcting devices 120 cooperate with each other to position the screen 20 relative to the table 90.

After the image taking operation, the screen frame 80 is released from the pushing by the X-axis-direction and Y-axis-direction pushing devices 102, 122. In addition, the screen frame 80 remains released from the fixation thereof to the frame-support table 90 by the clamp arms 136. More specifically described, as shown in FIG. 5A, the ball case 158 is held in contact with the inner flange 194 of the unit case 154 because of the biasing force of the spring 160, and the ball 156 is held at its advanced position. Thus, the screen frame 80 is kept, by the balls 156 held at their advanced positions, in a state in which the frame 80 is spaced away from the frame-support surface 190.

Then, the respective position correcting cylinders 104 of the X-axis-direction pushing-utilizing position correcting device 100 and the two Y-axis-direction pushing-utilizing position correcting devices 120 are operated so that the respective head portions 108 thereof cooperate with one another to move the screen 20 to the positions where the screen 20 is positioned relative to the printed wiring board 14 without any positional errors. Subsequently, the respective pushing cylinders 112 of the X-axis-direction and Y-axis-direction pushing devices 102, 122 are operated to push the screen frame 80 and thereby move the frame 80 relative to the frame-support table 90 in the directions parallel to the screen 20, so that the frame 80 is pressed against the head portions 108 via the rollers 110. Thus, the screen 20 is positioned at the positions to which the screen 20 is moved by the the X-axis-direction pushing-utilizing position correcting device 100 and the Y-axis-direction pushing-utilizing position correcting devices 120, such that the positional errors of the screen 20 relative to the frame-support table 90 are corrected and the positional errors of the screen 20 relative to the wiring board 14 are reduced to substantially zero.

When the positional errors of the screen 20 relative to the frame-support table 90 are corrected in this way, the four balls 156 are held at their advanced positions. Therefore, the screen frame 80 placed on the balls 156 is apart from the frame-support surface 190 of the table 90. When the pushing cylinders 112 push the screen frame 80 to move the screen 20, the balls 156 are rolled and accordingly the frame 80 is lightly moved relative to the table 90, so that the positions of the screen 20 can be finely adjusted. In particular, since each of the four balls 156 is rollably supported by the ball case 158 via the small round members 182, the each ball 156 is so easily rolled and the screen plate 82 is so lightly moved relative to the table 90. In addition, since the screen frame 80 can be pushed with a small force, the pushing cylinders 112 may be of a small size.

After the positions of the screen 20 relative to the frame-support table 90 are corrected, the respective clamp cylinders 132 of the four clamp units 130 are operated to retract the respective axis members 134, so that the respective clamp arms 136 are rotated to their operative positions and their fixing positions and, as shown in FIG. 5B, the clamp arms 136 push the screen frame 80 against the frame-support surface 190 and fix the screen plate 82 to the table 90. Consequently the four balls 156 are pushed by the screen frame 80, against the respective biasing forces of the springs 160, so that the balls 156 are moved to their retracted positions, where the balls 156 permit the screen frame 80 to contact the frame-support surface 190.

After the positions of the screen 20 relative to the frame-support table 90 are corrected and the screen 20 is fixed to the table 90, the printed wiring board 14 is elevated so that the print surface 12 of the wiring board 14 contacts a lower surface of the screen 20. Then, one of the two squeegees 46 is lowered to contact an upper surface of the screen 20, and is moved to move the creamed solder placed on the screen 20 so as to fill the solder into the through-holes 86, 88 of the screen 20 and thereby apply the solder to the print spots on the wiring board 14. Since the positional errors of the screen 20 relative to the wiring board 14 have been corrected, the creamed solder is accurately printed on the print spots on the printed wiring board 14. This is the filling step.

After the application of the creamed solder to one printed circuit board 14 is finished, the one squeegee 46 is elevated, and subsequently the screen 20 is moved relative to the wiring board 14, while being subjected to supersonic vibration. This is the moving step. To this end, the screen plate 82 is released from the fixation thereof to the frame-support table 90 by the fixing device 94 and, in this state, the respective position correcting cylinders. 104 of the X-axis-direction position correcting device 100 and the two Y-axis-direction position correcting devices 120 and the respective pushing cylinders 112 of the X-axis-direction pushing device 102 and the two Y-axis-direction pushing devices 122 are operated to move the screen frame 84 relative to the wiring board 14 by small distances, while the supersonic-vibration heads 204 of the screen-vibrating device 200 are contacted with the screen 20 to apply supersonic vibration to the same 20.

In the state in which the screen 20 is released from the fixation thereof by the fixing device 94, the screen frame 80 is spaced away from the frame-support surface 190 of the frame-support table 90, and are supported by the balls 156, as described previously. Therefore, like in the positional-error correcting operation, the screen frame 80 is moved lightly, and accurately even by small distances. In FIG. 5A, the space present between the screen frame 80 and the frame-support table 90 is exaggerated for easier understanding purposes only and, in fact, the space is very small. Providing that the screen 20 defines an ideal plane and accordingly does not sag downward in a state in which the screen frame 80 is supported by the balls 156 and is spaced from the frame-support surface 190, the screen 20 is spaced from the printed wiring board 14. However, if the distance by which the frame 80 is spaced from the table 90 is smaller than the thickness of the screen 20, the print patterns formed on the wiring board 14 do not fully come out of the through-holes 86, 88 when the screen 20 is separated from the wiring board 14, that is, large portions of the print patterns are left in the through-holes 86, 88. In addition, although the screen 20 is fixed to the screen frame 80 such that the screen 20 is stretched out without slack, portions of the screen 20 that are distant from the frame 80 and have the through-holes 86, 88 sag downward and are kept in contact with the wiring board 14. In the latter case, all the print patterns formed by the application of the creamed solder to the wiring board 14 are kept in the through-holes 86, 88. Thus, the screen frame 80 can be spaced from the frame-support table 90 such that at least a portion of each print pattern is left in one through-hole 86, 88 and, when the frame 80 is lightly moved, the through-holes 86, 88 are finely moved relative to the print patterns to produce respective clearances between the through-holes 86, 88 and the print patterns.

Figure 14:
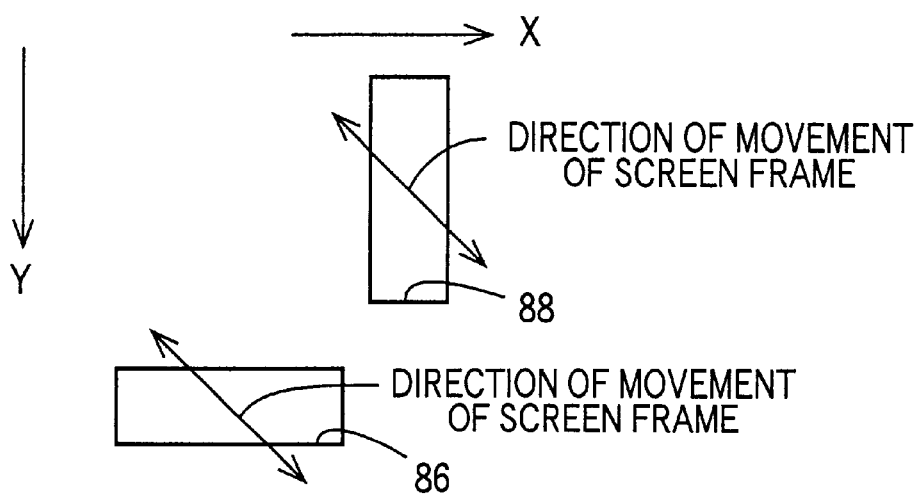
FIG. 14 is a view for explaining a locus of a movement of the screen relative to the printed wiring board in the screen-printing apparatus.

In the present embodiment, the through-holes 86, 88 of the screen 20 are elongate in the X-axis direction or the Y-axis direction that are perpendicular to each other on the horizontal plane. As shown in FIG. 14, the screen frame 80 is moved relative to the printed wiring board 14, in a plurality of cycles, in opposite directions which are inclined by 45 degrees with respect to each of the X-axis direction and the Y-axis direction, i.e., are parallel to a third straight line which is inclined by 45 degrees with respect to each of the first straight line parallel to the X-axis direction and the second straight line parallel to the Y-axis direction. Therefore, each of the through-holes 86, 88 is moved in each of the lengthwise direction thereof and a direction perpendicular to the lengthwise direction.

Providing that a direction in which the head 108 of each of the respective position correcting cylinders 104 of the X-axis-direction position correcting device 100 and the two Y-axis-direction position correcting devices 120 pushes the screen frame 80 is a forward direction and a direction in which the head 108 is moved away from the frame 80 is a backward direction, those position correcting cylinders 104 simultaneously move the respective heads 108 in the same directions by the same distances. The respective pushing cylinders 112 of the X-axis-direction pushing device 102 and the two Y-axis-direction pushing devices 122 that are opposed to the X-axis-direction position correcting device 100 and the two Y-axis-direction position correcting devices 120, respectively, retract, when the position correcting cylinders 104 push the screen frame 80, the respective heads 116, thereby permitting the movement of the frame 80; and the pushing cylinders 112 push, when the heads 108 of the position correcting cylinders 104 are moved away from the frame 80, the frame 80, thereby causing the frame 80 to follow the heads 108. The pushing cylinders 112 do not release the screen frame 80, and continue to push the same 80. However, since the force with which the pushing cylinders 112 push the frame 80 is small, the position correcting cylinders 104 are allowed to push the frame 80, while the heads 116 contact and push the frame 80 via the rollers 118.

The distance of movement of the screen 20 relative to the printed wiring board 14 is determined based on the smallest one of respective inner dimensions of the different sorts of through-holes as measured in the direction of movement of the screen 20, because the dimension of each clearance more depends on a smaller inner dimension than a greater inner dimension, in order that the each clearance may be produced between a through-hole and a print pattern, without leaving the print material on the side of the through-hole or without excessively deforming the print pattern. Thus, the distance of movement of the screen 20 is selected from a range of distance which is allowed by the smallest inner dimension. In the present embodiment, it is assumed that the inner dimension of the through-holes 86, 88 in the direction of movement of the screen 20 is the smallest and that the distance of movement of the screen 20 is determined based on the inner dimension of the through-holes 86, 88.

In the present embodiment, the thickness of the screen 20 is 150 $\mu$m, the width (i.e., dimension of the short 25 sides) of each of the through-holes 86, 88 is 150 $\mu$m, the diameter of the solder particles of the creamed solder is 30 $\mu$m, and the distance $\alpha$ of movement of the screen 20 relative to the printed wiring board 14 is 10 $\mu$m. The direction of movement of the screen 20 and the screen frame 80 is inclined by 45 degrees with respect to each of the X-axis and Y-axis directions. The ratio of the distance $\alpha$ to the inner dimension of each through-hole 86, 88 in the direction of movement can be defined as the ratio of the distance $\alpha$ of movement of the each through-hole 86, 88 in its widthwise direction to the width of the each through-hole 86, 88 as the short sides of the same 86, 88. The distance $\alpha$ is determined at a value which produces, between each through-hole 86, 88 and a print pattern formed by filling the each through-hole with the creamed solder, a clearance having a dimension suitable for the width of each through-hole 86, 88, that is, a clearance which does not excessively deform the print pattern and allows the print pattern to easily separate from the each through-hole. In addition, the speed at which the screen 20 is moved depends upon the viscosity of the creamed solder. In the present embodiment, the screen 20 is moved relative to the printed wiring board 14, first by the distance $\alpha$ in a forward direction, then by twice the distance $\alpha$, i.e., a distance 2$\alpha$ in a backward direction, and finally by the distance a in the forward direction, in the order of description, as will be explained later.

The screen frame 80 is moved in the forward direction when the frame 80 is pushed by the X-axis-direction and Y-axis-direction position correcting cylinders 104; and when the respective heads 108 of the position correcting cylinders 104 are moved away from the frame 80, the frame 80 is moved in the backward direction by being pushed by the X-axis-direction and Y-axis-direction pushing cylinders 112. Providing that each cycle consists of the movement of the distance $\alpha$ in the forward direction, the movement of the distance $2\alpha$ in the backward direction, and the movement of the distance $\alpha$ in the forward direction, the period of each cycle is determined at 0.25 second (i.e., 40 Hz), in the present embodiment. Since each of the position correcting cylinders 104 includes the servomotor 107, the distance and speed of movement of the screen 20 can be controlled, as needed, by controlling the respective positions of the heads 108.

The number of cycles of movement of the screen 20 is increased as the distance of movement of the screen 20 is decreased, because the inner dimension of a through-hole in the direction of movement decreases and accordingly the difficulty of separation of a print pattern from the through-hole increases. It can be said that the number of cycles is determined based on the inner dimension of the through-hole in the direction of movement. In the present embodiment, the inner dimension of each through-hole 86, 88 in the direction of movement is the smallest, and the distance of movement is determined based on the smallest inner dimension. The number of cycles is determined, based on the distance of movement, for the case where it is the most difficult for a print pattern to separate from a through-hole, in view of the ratio of the maximum inner dimension to the minimum inner dimension of each through-hole and the depth of the each through-hole.

Figure 15:
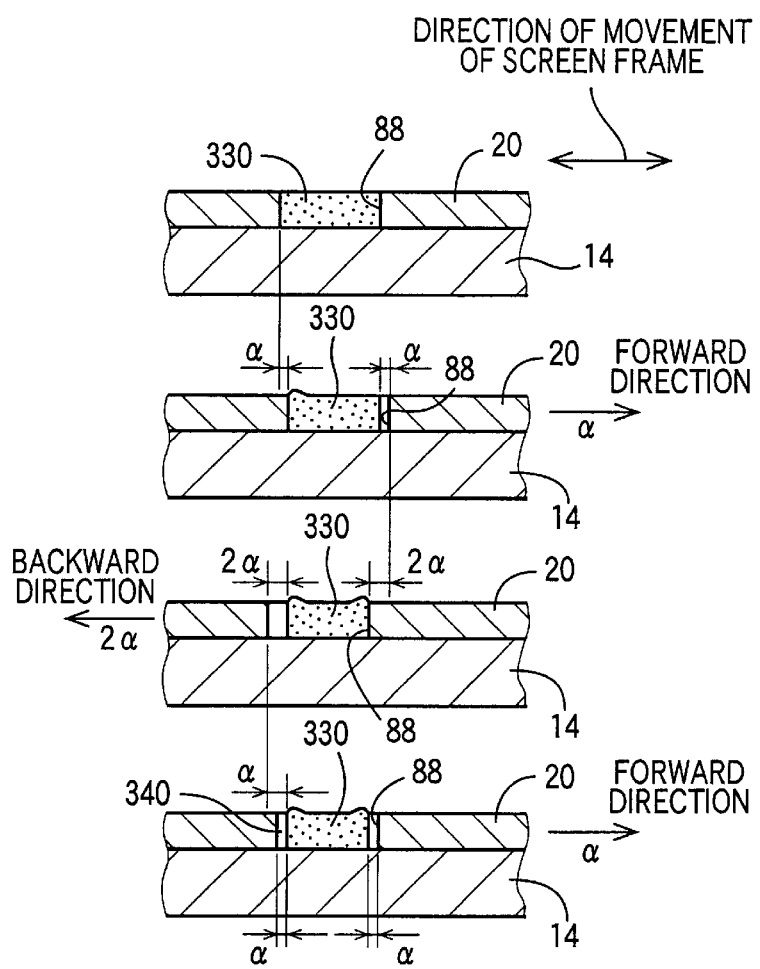
FIGS. 15A, 15B, 15C, and 15D are views of a first, a second, a third, and a fourth step of the movement of the screen relative to the printed wiring board.

FIGS. 15A, 15B, 15C, and 15D show a print pattern 330 which is formed by filling a through-hole 88 with creased solder. Clearances are produced between the print pattern 330 and the through-hole 88, as follows: FIG. 15A shows that after printing, there are no clearances between the print pattern 330 and the through-hole 88. FIG. 15B shows that when the screen frame 80 is moved by the distance a in the forward direction, a clearance having a width a is produced between the print pattern 330 and a downstream-side one of two inner surfaces of the through-hole 88 that are distant from each other in the direction of movement. The one inner surface is located on a downstream side of the through-hole in the direction of forward movement of the screen frame 80 or the screen 20. FIG. 15C shows that when the screen frame 80 is moved by the distance $2\alpha$ in the backward direction, a clearance having a width $2\alpha$ is produced between the print pattern 330 and the other of the two inner surfaces of the through-hole 88 that are distant from each other in the direction of movement. The other inner surface is located on a downstream side of the through-hole in the direction of backward movement of the screen frame 80. FIG. 15D shows that when the screen frame 80 is moved by the distance $\alpha$ in the forward direction, two clearances 340 each having the width a are produced between the two inner surfaces of the through-hole 88 and two outer surfaces of the print pattern 330, respectively, that are distant from each other in the direction of movement.

Since the direction of movement of the screen 20 is inclined by 45 degrees with respect to each of the X-axis and Y-axis directions, a uniform clearance having a width defined by the distance $\alpha$ is produced, between the entire periphery of the print pattern 330 and the inner surface of the through-hole 88, in each of the X-axis and Y-axis directions.

In the present embodiment, the width is 7 $\mu$m. This is true with the print patterns formed by filling the through-holes 86 with the creamed solder, and with the print patterns formed by filling the other through-holes, not shown, than the through-holes 86, 88 with the creamed solder. In the present embodiment, the screen frame 80 is moved in a plurality of cycles, and accordingly clearances are reliably produced between the respective inner surfaces of the plurality of through-holes including the through-holes 86, 88, and the print patterns.

Meanwhile, the supersonic-vibration heads 204 of the screen vibrating device 200 are moved by the movement of the movable member 52, to a prescribed position in the X-axis direction and, in that state, the heads 204 are lowered by the elevating and lowering device 206 to be contacted with respective prescribed positions on the screen 20. The respective positions of the supersonic-vibration heads 204 of the screen vibrating device 200 are so adjusted, in advance, that the heads 204 are contacted with respective positions on the screen 20 that particularly need vibration, e.g., positions where a lot of through-holes 86, 88 are present, or positions where through-holes are provided at a small pitch. Thus, a plurality of portions of the screen 20 are simultaneously subjected to the supersonic vibration. While the screen frame 80 is moved relative to the printed wiring board 14, the screen 20 is subjected to the supersonic vibration. Thus, the separation of the print patterns from the respective inner surfaces of the through-holes 86, 88 is promoted.

After the screen 20 is moved relative to the printed wiring board 14 in the prescribed number of cycles, the screen 20 is moved back to its initial position before the relative movement. However, the supersonic vibration of the screen 20 is not stopped. In this state, the wiring board 14 is lowered, and is separated from the screen 20. This is the separating step. After the wiring board 14 is separated from the screen 20, the supersonic vibration is stopped, and the supersonic-vibration heads 204 are separated from the screen 20. Since a clearance has been produced between the entire periphery of each print pattern 330 and the inner surface of a corresponding through-hole 86, 88, because of the above-described movement of the screen 20, the print pattern is clearly separated from the through-hole 86, 88, such that no portion of the creamed solder printed on the wiring board 14 is adhered to the inner surface of the through-hole 86, 88. Thus, the print pattern is free of the problems that the amount of the print material printed is short and the shape of the print pattern has a defect. In addition, since a uniform clearance is produced all around the entire periphery of the print pattern, the center of the print pattern is not moved out of position, so that when an electric component is mounted on the wiring board 14, a lead wire of the electric component is reliably connected to the conductor pattern formed on the print surface 12. Moreover, the screen 20 is moved by the screen-frame moving device 92, which is for moving the screen 20 to correct the positional errors of the screen 20 relative to the wiring board 14. Therefore, the present screen printing apparatus need not be largely modified to obtain the function of producing clearances. Thus, the present apparatus can move, with ease and at low cost, the screen 20, and thereby produce clearances between the print patterns and the inner surfaces of the through-holes.

It emerges from the foregoing description that the board elevating and lowering device 18 provides a first moving device which moves the board supporting device 16 toward, and away from, the screen frame 80 so that the printed wiring board 14 is contacted with, and separated from, the screen 20; a portion of the control device 310 that controls the screen-frame moving device 92 to produce clearances between the print patterns 330 and the through-holes 86, 88 provides a clearance-produce control portion; the reference-mark-image taking device 260 and a portion of the control device 310 that calculates, based on the images taken by the device 260, the positional errors between the screen 20 and the wiring board 14 cooperate with each other to provide a positional-error detecting device; and a portion of the control device 310 that controls the screen-frame moving device 92 to reduce the positional errors between the screen 20 and the wiring board 14 provides a position-correct control portion.

In the above-described embodiment, the screen frame 80 is moved relative to the print wiring board 14 in the opposite directions which are inclined by 45 degrees with respect to each of the X-axis and Y-axis directions perpendicular to each other on the horizontal plane. However, the screen frame 80 may be moved relative to the wiring board 14, by the screen-frame moving device 92 under control of the control device 310, in such a manner that an arbitrary point on the screen 20 describes a circle relative to the wiring board 14. This manner will be described below by reference to a second embodiment of the present invention, shown in FIGS. 16 and 17.

In the second embodiment, the screen frame 80 is moved such that an arbitrary point on the screen 20 starts, relative to the printed wiring board 14, from an initial position of the point, describes a spiral curve, reaches a circle whose center is the initial position, moves around on the circle, moves back on the spiral curve, and returns to the initial position. The screen 20 has a plurality of through-holes which may have a rectangular shape like the through-holes employed in the first embodiment, or a different shape. In the present embodiment, it is assumed that the screen 20 has a plurality of through-holes 350 each having a circular shape, for easier illustration and understanding purposes only.

Figure 16:
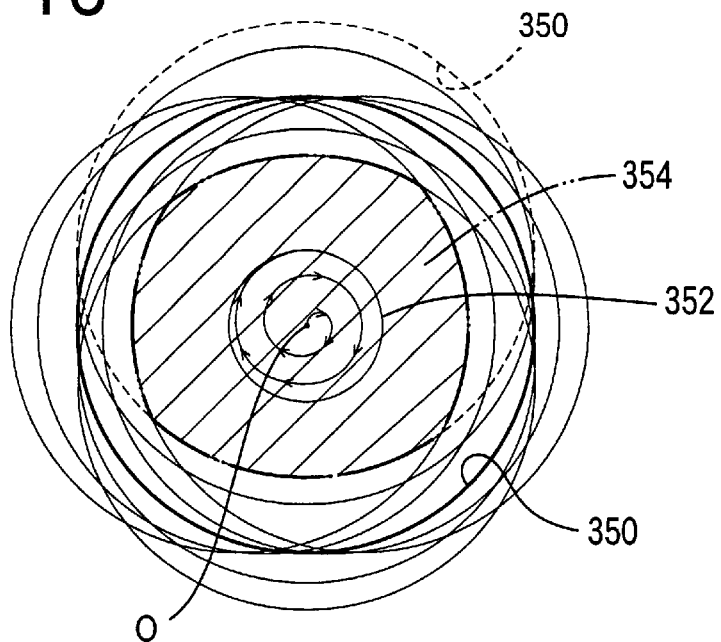
FIG. 16 is a view for explaining a portion of a locus of a movement of a screen relative to a printed wiring board in another screen-printing apparatus as a second embodiment of the present invention.
Figure 17:
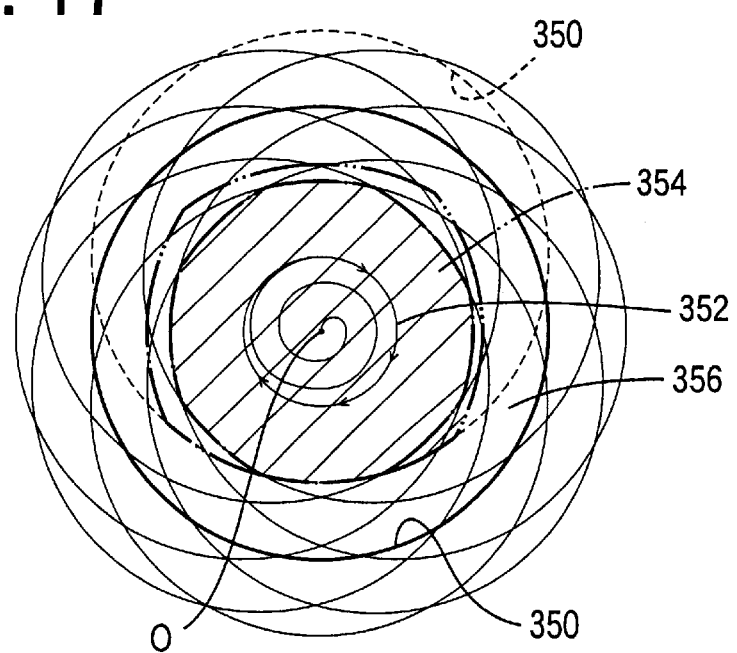
FIG. 17 is a view for explaining the remaining portion of the locus of movement of the screen of FIG. 16 relative to the printed wiring board.

In a state before the screen frame 80 is moved after printing, each of the through-holes 350 has been filled up with the creamed solder, with no spaces left therein, that is, a print pattern having a circular cross section with the same diameter as that of the each through-hole 350 has been formed on the print surface 12 of the wiring board 14. Providing, as shown in FIG. 16, that a center, O, of the through-hole 350 is an arbitrary point on the screen 20 and that a position of the center O in a state before the screen 20 is moved relative to the wiring board 14 is an initial position of the center O, the screen frame 80 is moved relative to the wiring board 14 such that the center O is moved to describe a spiral locus which has both a component in a circumferential direction of a circle 352 whose center is the initial position, and a component in a radial direction of the circle 352, and whose diameter gradually increases as the center O is advanced in the circumferential direction. The respective position correcting cylinders 104 of the X-axis-direction position correcting device 100 and the Y-axis-direction position correcting device 120 cooperate with each other to change the positions of the screen frame 80 such that the center O moves to describe the spiral locus. In FIGS. 16 and 17, respective thin solid lines indicate respective positions which are taken by the through-hole 350 while the screen frame 80 is moved relative to the wiring board 14, that is, a locus of movement of the through-hole 350.

In a state in which the center O has described the spiral locus and reached the circle 352 whose center is the initial position of the center O, a print pattern 354 is more or less deformed as indicated at two-dot chain line and hatched at inclined lines in FIG. 16. In addition, a portion of an inner surface of the through-hole 350 is contacted with the print pattern 354, as indicated at broken line. When the center O is further moved on the circle 352, as shown in FIG. 17, the print pattern 354 is further deformed and the size thereof is reduced, as indicted at one-dot chain line and hatched by inclined lines. FIGS. 16 and 17 shows the print pattern 354 which is defined by respective positions taken by the through-hole 350 while the screen frame, 80 is moved relative to the wiring board 14, and which accordingly has apexes. However, in fact, since the through-hole 350 is continuously moved, the print pattern 354 has a continuous periphery.

A broken line indicates the position taken by the through-hole 350 whose center O has just moved around one time on the circle 352, where a portion of the inner surface of the through-hole 350 is contacted with the print pattern 354. Then, in the present embodiment, the screen frame 80 is moved such that the center O is moved back to its initial position on the same locus. When the through-hole 350 returns to the position indicated by thick solid line in FIG. 17, a clearance 356 having a uniform width is produced between the entire periphery of the print pattern 354 and the inner surface of the through-hole 350, without moving the center O of the through-hole 350 out of position. The width of the clearance 356 is equal to the radius of the circle 352, which is determined at a value which is suitable for an inner dimension of the through-hole 350 in the direction of movement of the screen frame 80, that is, a value which assures that the print pattern 354 is separated from the through-hole 350 with no creamed solder left on the inner surface of the through-hole 350 and that the print pattern 354 is not excessively deformed. As viewed in a radial direction of the circle 352, it can be said that the center O is moved first by a distance $a$ equal to the width of the clearance 356 in a forward direction, subsequently by a distance $2\alpha$ in a backward direction, and then by the distance $\alpha$ in the forward direction. The radius of the circle 352, i.e., the distance $\alpha$ may be a value which satisfies the condition recited in the previously-explained third feature (3). Providing that one cycle consists of the movement of the center O starting from its initial position and returning to the same, the screen frame 80 is moved relative to the printed wiring board 14 in one or more cycles and, after this movement, the wiring board 14 is separated from the screen 20.

Otherwise, the screen frame 80 may be moved relative to the printed wiring board 14 such that the center O of the through-hole 350 describes such a locus that the center O starts from its initial position, moves in a radial direction of the circle 352, and reaches the circle 352.

Figure 18:
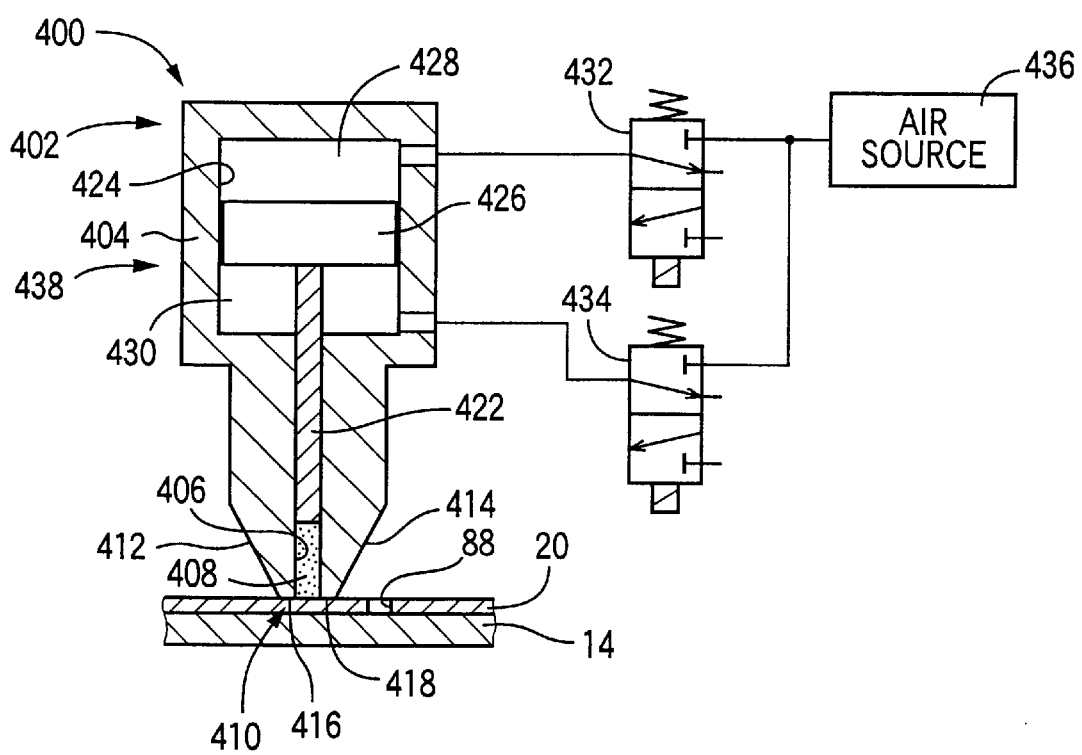
FIG. 18 is a cross-sectioned, front view of a pressure-utilizing applying head of a pressure-utilizing applying device of another screen-printing apparatus as a third embodiment of the present invention.

In each of the first and second embodiments, the filling device is provided by the squeegee device 44 which includes the two squeegees 46 each of which moves the creamed solder placed on the screen 20 and thereby forces the creamed solder into the through-holes of the screen 20. However, the screamed solder may be accommodated in a storing device and may be pushed, by pressure, out of the storing device to fill the through-holes of the screen 20. This manner will be described by reference to a third embodiment shown in FIG. 18.

The present screen-printing apparatus includes, as the filling device, a pressure-utilizing applying device 400. Thus, the present apparatus can be said as a pressure-utilizing printing apparatus. The pressure-utilizing applying device 400 includes a pressure-utilizing applying head 402 which is moved in the X-axis direction by a moving device, not shown, and is elevated and lowered by an elevating and lowering device, not shown, to be contacted with, and separated from, the screen 20, like each of the squeegees 46 employed in the first or second embodiment. The pressure-utilizing applying head 402 includes a housing 404 which defines a creamed-solder storing chamber 406 in which a creamed solder 408 is stored or accommodated. The creamed-solder storing chamber 406 is elongate in a widthwise direction of the screen 20, i.e., a direction perpendicular to the direction of movement of the applying head 402, and opens in a lower surface 410 of the housing 404. The housing 404 has, on both sides of the lower surface 410 as viewed in the print direction (i.e., left-right direction in FIG. 18), respective inclined surfaces 412, 414 which are inclined downward in respective directions in which the two surfaces 412, 414 approach the opening of the creamed-solder storing chamber 406. The lower surface 410 includes two planar press surfaces 416, 418 which are contiguous with the two inclined surfaces 412,. 414, respectively, and which are parallel to, and very short in, the print direction.

A push plate 422 as a push member is fitted in the creamed-solder storing chamber 406, such that the push plate 422 is movable upward and downward. In the present embodiment, the push plate 422 has a constant thickness, and has dimensions which assure that the push plate 422 is fitted in the storing chamber 406 such that the plate 422 is movable upward and downward and no spaces are left between the plate 422 and a lower portion of the housing 404 that defines the chamber 406, both in the direction of movement of the applying head 402 and in the widthwise direction of the same 402. The push plate 422 has two upper-end portions which project into two cylinder bores 424, respectively, which are provided on the top of the chamber 406. The two cylinder bores 424 are arranged in a horizontal direction perpendicular to the print direction. The two upper-end portions of the push plate 422 are movable upward and downward in the two cylinder bores 424, respectively.

Two pistons 426 are fitted in the two cylinder bores 424, respectively, such that the two pistons 426 are movable upward and downward, and the two upper-end portions of the push plate 422 are fixed to the two pistons 426, respectively. In each of the two cylinder bores 424, two air chambers 428, 430 are provided above and below the corresponding piston 426, respectively. The two air chambers 428, 430 are selectively communicated, via two solenoid-operated switch valves 432, 434, with an air source 436 or the atmosphere, so that the pistons 426 are moved and the push plate 422 is elevated or lowered. Thus, the two pistons 426 and the two cylinder bores 424 cooperate with each other to provide two air cylinders 438 each as a push-member driving or moving device. The two switch valves 432, 434 are commonly used for the two air cylinders 438. In the case where the width of the screen 20 is short, the two air cylinders 438 may be replaced with a single air cylinder 438.

Like in each of the first and second embodiments, when the creamed solder is printed on the printed wiring board 14, the relative-positional errors between the screen 20 and the wiring board 14 are corrected, subsequently the wiring board 14 is contacted with the screen 20, and then the applying head 402 is lowered to press the press surfaces 416, 418 against the screen 20. Next, the push plate 422 is lowered by the air cylinders 438 to apply a pushing pressure to the creamed solder 408. However, since the applying head 402 is pressed against the screen 20 and the opening of the creamed-solder storing chamber 406 is closed by the screen 20, the creamed solder 408 does not come out of the chamber 406 and receives an appropriate pressure from the push plate 422.

When the applying head 402 is moved along the screen 20 by the moving device, the creamed solder 408 stored in the creamed-solder storing chamber 406 is prevented from leaking from the chamber 406, by a downstream one of the two press surfaces 416, 418 as viewed in the print direction, on one hand, and the solder 408 is scraped from an upper surface of the screen 20, by an upstream one of the two press surfaces 416, 418, on the other hand. Thus, the creamed solder 408 is kept in the storing chamber 406 and, when the applying head 402 is moved, the creamed solder 408 is moved on the screen 20 while being pressed on the upper surface of the screen 20 that is opposite to the printed wiring board 14. Each time the creamed solder 408 faces each one of the through-holes 88 of the screen 20, an appropriate amount of solder 408 corresponding to the one through-hole 88 is forced into the one through-hole 88 to form a print pattern. An excessive amount of solder 408 is scraped by the upstream one of the two press surfaces 416, 418 as viewed in the direction of movement of the applying head 402, and the one through-hole 88 is just filled up with the appropriate amount of solder 408 applied to the wiring board 14.

After the application of the creamed solder 408, the applying head 402 is moved upward and accordingly is separated from the screen 20. To this end, the two air chambers 428, 430 of each of the two air cylinders 438 are communicated with the atmosphere, and the applying head 402 is moved in a horizontal direction by the moving device while being moved upward by the elevating and lowering device. Therefore, a portion of the creamed solder 408 that is present in the opening of the screamed-solder storing chamber 406 and is contacted with the screen 20, is scraped by the upstream one of the two press surfaces 416, 418 as viewed in the direction of movement of the applying head 402 and, because of the viscosity thereof, separates from the screen 20 and follows the housing 404. Thus, the applying head 402 is separated from the screen 20, with no creamed solder 408 left on the screen 20. Subsequently, like in each of the first and second embodiments, the screen 20 is moved relative to the wiring board 14 to produce respective clearances between the through-holes 86 and the print patterns.

In each of the first to third embodiments, the screen-frame moving device 92 functions as the moving device which moves at least one of the screen holding device 80 which holds the screen 20, and the substrate holding device 16 which holds the substrate 14, relative to the other of the screen holding device and the substrate holding device. However, the screen-frame moving device 92 may be replaced with a different screen-frame moving device. This manner will be described below by reference to a fourth embodiment shown in FIG. 19.

In the fourth embodiment, a screen frame 482 which holds a screen 480 has, in a portion thereof extending in the X-axis direction, two elongate holes 484 extending in the X-axis direction, and has, in another portion thereof extending in the Y-axis direction, one elongate hole 486 extending in the Y-axis direction. An eccentric cam 488 is fitted in each of the three elongate holes 484, 486, such that the eccentric cam 488 is rotatable relative to the screen frame 482 about a vertical axis line perpendicular to a horizontal plane on which the screen 480 extends. The three eccentric cams 488 are rotated by three servomotors 490, respectively, each of which is a sort of electric motor as a drive source. Each of the servomotors 490 is fixed to a frame-support surface 493 of a frame-support table 492, such that the each servomotor 490 is oriented in a vertical direction perpendicular to the frame-support surface 493. Each of the three servomotors 490 has a rotary axis member 494 which is fixed to a corresponding one of the three eccentric cams 488, at a position offset from a center of the one cam 488. The three eccentric cams 488 and the three servomotors 490 cooperate with each other to provide a screen-frame moving device 496.

The two servomotors 490 which rotate the respective eccentric cams 488 fitted in the two elongate holes 484 extending in the X-axis direction, are driven in synchronism with each other by a control device 500. When those two eccentric cams 488 are rotated, the screen frame 482 is moved in the Y-axis direction. This movement is permitted by the movement of the elongate hole 486 extending in the Y-axis direction, relative to the third eccentric cam 488 fitted in the hole 486, while being guided by the hole 486 and the third cam 488. When the third eccentric cam 488 fitted in the elongate hole 486 extending in the Y-axis direction is rotated, the screen frame 482 is moved in the X-axis direction. This movement is permitted by the movement of the two elongate holes 484 extending in the X-axis direction, relative to the first and second eccentric cams 488 fitted in the two holes 486, while being guided by the holes 486 and the first and second cams 488. Thus, the combination of the respective rotations of the three eccentric cams 488 can cause the screen frame 482 to move relative to the printed wiring board 14 to describe a desired locus, and thereby produce respective clearances between respective print patterns and respective inner surfaces of a plurality of through-holes of the screen 480. The screen-frame moving device 496 may be used to move the screen 480 relative to the wiring board 14 and thereby correct one or more relative-positional errors between the screen 480 and the board 14.

In the embodiment shown in FIGS. 1 to 15, the screen 20 is moved relative to the printed wiring board 14 in each of the X-axis and Y-axis directions. However, it is possible that the screen 20 be moved relative to the wiring board 14 in only one of the X-axis and Y-axis directions.

In the embodiment shown in FIGS. 16 to 17, the screen 20 may be moved relative to the printed wiring board 14, in such different manners that an arbitrary point on the screen 20 is moved to describe a spiral locus only, or a circle only. In the former case, for example, the screen 20 is moved relative to the wiring board 14 till the center 0 of the through-hole 350 describes the spiral locus and reaches the circle 352. Subsequently, the screen 20 and the wiring board 14 may, or may not, be returned to their initial relative position.

In the embodiment shown in FIGS. 1 to 15, the screen 20 may be moved relative to the printed wiring board 14, in two directions perpendicular to each other, independent of each other. In this case, it is possible to determine, for each of the two directions, a distance α of movement of the screen 20, based on an inner dimension of each through-hole 86, 88 in the each direction. In addition, it is possible to determine, for each of the two directions, a number of cycles of movement of the screen 20. Otherwise, it is possible to determine, for only one of the two directions, a distance α of movement of the screen 20, or a number of cycles of movement of the screen 20, and apply the thus determined distance α or number of cycles to the other direction. In the last case, for example, it is possible to determine, for only one of the two directions that is more difficult for printed patterns to separate from through-holes, a distance α of movement of the screen 20, or a number of cycles of movement of the screen 20.

In the embodiment shown in FIGS. 1 to 15, the screen 20 is moved relative to the printed wiring board 14, in opposite directions which are inclined by 45 degrees with respect to each of two directions perpendicular to each other. However, the degree of inclination is not limited to 45 degrees and may be a different angle. For example, the degree of inclination may be determined according to the shape or size of each through-hole. In particular, in the case where each of through-holes has a rectangular shape and all the through-holes are oriented in the same direction, the screen 20 may be moved relative to the wiring board 14, in diagonal directions of the through-holes.

In the case where all the elongate through-holes of a screen extend parallel to one straight line, it is preferred to move the screen relative to a substrate in both the lengthwise direction of the through-holes and a direction perpendicular to the lengthwise direction.

In each of the illustrated embodiments, in the state in which the screen 20, 480 is not fixed by the fixing device 94, the screen frame 80, 482 is supported by the balls 156 and accordingly is lightly moved, for example, at the time of correction of one or more positional errors. However, it is not essentially required that the frame-support table 90, 492 be provided with the ball units 150, or that the screen frame 80, 482 be supported by the balls 156 so as to be kept away from the table 90, 492. That is, the screen frame 80, 482 may be supported by the frame-support surface 190, 493 of the frame-support table 90, 492, not only when the screen 20, 480 is fixed to the table 90, 492, but also when the screen 20, 480 is released from the table 90, 492 and is moved relative to the same.

In each of the illustrated embodiments, the screen 20, 480 is subjected to the supersonic vibration. However, the screen frame 80, 482 may be subjected to the supersonic vibration. In the latter case, the supersonic-vibration heads 204 may be contacted with the screen 20, 480, in a direction perpendicular to the screen 20, 480, or a direction parallel to the same. Otherwise, the printed wiring board 14 may be subjected to the supersonic vibration.

When the printed wiring board 14 is separated from the screen 20, 480, the supersonic vibration of the screen 20, 480 may be stopped.

While the screen 20, 480 is moved relative to the printed wiring board 14 to produce respective clearances 340, 356 between print patterns 330, 354 and respective inner surfaces of the through-holes 86, 88, 350, the wiring board 14 may be separated from the screen 20, 480.

In each of the illustrated embodiments, it is not essentially required to subject at least one of the screen 20, 480 and the printed wiring board 14 to the supersonic vibration. The supersonic vibration may be omitted.

In each of the illustrated embodiments, the screen 20, 480 is moved relative to the printed wiring board 14 to produce the clearances 340, 356 between the print patterns 330, 354 and the through-holes 86, 88, 350. However, it is possible to move the wiring board 14 relative to the screen 20, 480, or move both the wiring board 14 and the screen 20, 480 relative to each other. In the latter cases, the moving device which moves the wiring board 14 relative to the screen 20, 480 may be provided by a device similar to the screen-frame moving device 92.

Each of the respective pushing cylinders 112 of the X-axis-direction and Y-axis-direction pushing devices 102, 122 may be provided by an electric cylinder. In the latter case, the electric motor employed in the electric cylinder may be one which is controllable with respect to rotation angle or amount.

Moreover, the present invention is applicable to such a screen-printing method and a screen-printing apparatus each of which superposes, for forming solder bumps on a substrate having an electric circuit, a screen having through-holes, on the substrate, and fills the through-holes with creamed solder to apply the solder to the electric circuit.

While the present invention has been described in detail in its preferred embodiments, it is to be understood that the present invention is by no means limited to the details of those embodiments but may be embodied with not only the features (1) to (19) described in SUMMARY OF THE INVENTION but also other changes, modifications, and improvements that may occur to one skilled in the art without departing from the scope and spirit of the present invention defined in the appended claims.

What is claimed is:

1. A screen-printing method, comprising the steps of:

filling, in a state in which a screen having a plurality of through-holes is contacted with a print surface of a substrate, the through-holes with a print material, and thereby applying the print material to the print surface of the substrate, moving, after the filling step, at least one of the screen and the substrate relative to the other of the screen and the substrate, in at least one cycle, on a plane parallel to the print surface of the substrate, and separating, after the moving step, the screen and the substrate from each other, wherein said plurality of through-holes comprise at least one first elongated hole which is elongated in a first direction parallel to a first straight line parallel to the print surface, and at least one second elongated hole which is elongated in a second direction parallel to a second straight line parallel to the print surface and perpendicular to the first straight line, and wherein the moving step comprises moving, in each of said first and second directions, said at least one of the screen and the substrate relative to said other of the screen and the substrate, in said at least one cycle.

2. A screen-printing method, comprising the steps of:

filling, in a state in which a screen having a plurality of through-holes is contacted with a print surface of a substrate, the through-holes with a print material, and thereby applying the print material to the print surface of the substrate, moving, after the filling step, at least one of the screen and the substrate relative to the other of the screen and the substrate, in at least one cycle, on a plane parallel to the print surface of the substrate, and separating, after the moving step, the screen and the substrate from each other, wherein said plurality of through-holes comprise at least one first elongated hole which is elongated in a first direction parallel to a first straight line parallel to the print surface, and at least one second elongated hole which is elongated in a second direction parallel to a second straight line parallel to the print surface and perpendicular to the first straight line, and wherein the moving step comprises moving, in a third direction parallel to a third straight line inclined with respect to each of the first and second straight lines and parallel to the print surface, said at least one of the screen and the substrate relative to said other of the screen and the substrate, in said at least one cycle.

3. A screen-printing method, comprising the steps of:

filling, in a state in which a screen having a plurality of through-holes is contacted with a print surface of a substrate, the through-holes with a print material, and thereby applying the print material to the print surface of the substrate, moving, after the filling step, at least one of the screen and the substrate relative to the other of the screen and the substrate, in at least one cycle, on a plane parallel to the print surface of the substrate, and separating, after the moving step, the screen and the substrate from each other, wherein the moving step comprises moving said at least one of the screen and the substrate relative to said other of the screen and the substrate, in said at least one cycle, on said plane parallel to the print surface of the substrate, in each of an X-axis direction and a Y-axis direction parallel to an X axis and a Y axis, respectively, which are perpendicular to each other on said plane.

4. The method according to claim 3, wherein said one cycle comprises a first forward movement of said at least one of the screen and the substrate by a distance, a backward movement of said at least one of the screen and the substrate by twice said distance, and a second forward movement of said at least one of the screen and the substrate by said distance, in an order of description.

5. The method according to claim 4, wherein said distance is not smaller than one hundredth of an inner dimension of one of the through-holes in said one direction and not greater than one fifth of said inner dimension.

6. The method according to claim 3, wherein the moving step comprises moving said at least one of the screen and the substrate relative to said other of the screen and the substrate, to describe such a relative-movement locus that an arbitrary point on the screen moves, relative to the substrate, from an initial position of the arbitrary point to a point on a circle whose center is the initial position, and then moves on the circle.

7. The method according to claim 6, wherein a portion of the relative-movement locus that corresponds to the movement of the arbitrary point from the initial position thereof to the point on the circle whose center is the initial position, comprises a first component in a circumferential direction of the circle and a second component in a radial direction of the circle.

8. The method according to claim 7, wherein said portion of the relative-movement locus that comprises the first and second components comprises a spiral curve whose diameter increases as the arbitrary point moves from the initial position thereof toward the circle.

9. The method according to claim 6, wherein the moving step comprises moving said at least one of the screen and the substrate relative to said other of the screen and the substrate, so that the arbitrary point on the screen moves back, relative to the substrate, to the initial position of the arbitrary point.

10. A screen-printing method, comprising the steps of:

filling, in a state in which a screen having a plurality of through-holes is contacted with a print surface of a substrate, the through-holes with a print material, and thereby applying the print material to the print surface of the substrate, moving, after the filling step, at least one of the screen and the substrate relative to the other of the screen and the substrate, in at least one cycle, on a plane parallel to the print surface of the substrate, and separating, after the moving step, the screen and the substrate from each other, wherein the moving step comprises moving said at least one of the screen and the substrate relative to said other of the screen and the substrate, to describe such a relative-movement locus that an arbitrary point on the screen moves, relative to the substrate, from an initial position of the arbitrary point, along a spiral curve whose diameter increases as the arbitrary point moves at least one time around the initial position.

11. A screen-printing method, comprising the steps of:

filling, in a state in which a screen having a plurality of through-holes is contacted with a print surface of a substrate, the through-holes with a print material, and thereby applying the print material to the print surface of the substrate, moving, after the filling step, at least one of the screen and the substrate relative to the other of the screen and the substrate, in at least one cycle, on a plane parallel to the print surface of the substrate, and separating, after the moving step, the screen and the substrate from each other, wherein the moving step comprises moving said at least one of the screen and the substrate relative to said other of the screen and the substrate, to describe a circle whose center is an arbitrary point on the screen.

12. A screen-printing method, comprising the steps of:

filling, in a state in which a screen having a plurality of through-holes is contacted with a print surface of a substrate, the through-holes with a print material, and thereby applying the print material to the print surface of the substrate, moving, after the filling step, at least one of the screen and the substrate relative to the other of the screen and the substrate, in at least one cycle, on a plane parallel to the print surface of the substrate, in at least one direction parallel to at least one straight line, and separating, after the moving step, the screen and the substrate from each other, wherein a period of said one cycle is not shorter than 0.001 second and not longer than 1 second.

13. A screen-printing method, comprising the steps of:

filling, in a state in which a screen having a plurality of through-holes is contacted with a print surface of a substrate, the through-holes with a print material, and thereby applying the print material to the print surface of the substrate, moving, after the filling step, at least one of the screen and the substrate relative to the other of the screen and the substrate, in at least one cycle, on a plane parallel to the print surface of the substrate, in at least one direction parallel to at least one straight line, and separating, after the moving step, the screen and the substrate from each other, wherein the moving step comprises moving said at least one of the screen and the substrate relative to said other of the screen and the substrate in said at least one cycle, and simultaneously vibrating at least one of the screen and the substrate at a period shorter than a period of said one cycle.

14. The method according to claim 13, wherein the vibrating step comprises vibrating said at least one of the screen and the substrate at a supersonic frequency.

15. A screen-printing method, comprising the steps of:

filling, in a state in which a screen having a plurality of through-holes is contacted with a print surface of a substrate, the through-holes with a print material, and thereby applying the print material to the print surface of the substrate, moving, after the filling step, at least one of the screen and the substrate relative to the other of the screen and the substrate, in at least one cycle, on a plane parallel to the print surface of the substrate, in at least one direction parallel to at least one straight line, and separating, after the moving step, the screen and the substrate from each other, wherein the moving step comprises moving, with an actuator which is for correcting at least one positional error between the screen and the substrate in said at least one direction parallel to the print surface of the substrate, said at least one of the screen and the substrate relative to said other of the screen and the substrate.

16. The method according to claim 15, wherein the actuator comprises an electric motor which is controllable with respect to an angle of rotation thereof.

17. A screen printing apparatus, comprising:

a screen holding device which holds a screen having a plurality of through-holes;

a substrate holding device which holds a substrate;

a first moving device which moves at least one of the screen and the substrate toward, and away from, the other of the screen and the substrate, so that the screen and the substrate are contacted with, and separated from, each other;

a filling device which fills, in a state in which the screen is contacted with a print surface of the substrate, the through-holes with a print material and thereby prints the print material on the print surface of the substrate;

a second moving device which moves, in said state in which the screen is contacted with the substrate, at least one of the screen holding device and the substrate holding device relative to the other of the screen holding device and the substrate holding device, on a plane parallel to the print surface of the substrate; and a control device which controls the first moving device, the filling device, and the second moving device, the control device comprising a clearance-produce control portion which controls the second moving device to move at least one of the screen and the substrate relative to the other of the screen and the substrate, in at least one cycle, and thereby produce respective clearances between respective inner surfaces of the through-holes of the screen and the print material printed on the print surface of the substrate, wherein said plurality of through-holes of the screen comprise at least one first elongated hole which is elongated in a first direction parallel to a first straight line parallel to the print surface, and at least one second elongated hole which is elongated in a second direction parallel to a second straight line parallel to the print surface and perpendicular to the first straight line, and wherein the clearance-produce control portion controls the second moving device to move, in each of said first and second directions, said at least one of the screen and the substrate relative to said other of the screen and the substrate, in said at least one cycle.

18. A screen printing apparatus, comprising:

a screen holding device which holds a screen having a plurality of through-holes;

a substrate holding device which holds a substrate;

a first moving device which moves at least one of the screen and the substrate toward, and away from, the other of the screen and the substrate, so that the screen and the substrate are contacted with, and separated from, each other;

a filling device which fills, in a state in which the screen is contacted with a print surface of the substrate, the through-holes with a print material and thereby prints the print material on the print surface of the substrate;

a second moving device which moves, in said state in which the screen is contacted with the substrate, at least one of the screen holding device and the substrate holding device relative to the other of the screen holding device and the substrate holding device, on a plane parallel to the print surface of the substrate; and a control device which controls the first moving device, the filling device, and the second moving device, the control device comprising a clearance-produce control portion which controls the second moving device to move at least one of the screen and the substrate relative to the other of the screen and the substrate, in at least one cycle, and thereby produce respective clearances between respective inner surfaces of the through-holes of the screen and the print material printed on the print surface of the substrate, wherein said plurality of through-holes of the screen comprise at least one first elongated hole which is elongated in a first direction parallel to a first straight line parallel to the print surface, and at least one second elongated hole which is elongated in a second direction parallel to a second straight line parallel to the print surface and perpendicular to the first straight line, and wherein the clearance-produce control portion controls the second moving device to move, in a third direction parallel to a third straight line inclined with respect to each of the first and second straight lines and parallel to the print surface, said at least one of the screen and the substrate relative to said other of the screen and the substrate, in said at least one cycle.

19. A screen printing apparatus, comprising:

a screen holding device which holds a screen having a plurality of through-holes;

a substrate holding device which holds a substrate;

a first moving device which moves at least one of the screen and the substrate toward, and away from, the other of the screen and the substrate, so that the screen and the substrate are contacted with, and separated from, each other;

a filling device which fills, in a state in which the screen is contacted with a print surface of the substrate, the through-holes with a print material and thereby prints the print material on the print surface of the substrate;

a second moving device which moves, in said state in which the screen is contacted with the substrate, at least one of the screen holding device and the substrate holding device relative to the other of the screen holding device and the substrate holding device, on a plane parallel to the print surface of the substrate; and a control device which controls the first moving device, the filling device, and the second moving device, the control device comprising a clearance-produce control portion which controls the second moving device to move at least one of the screen and the substrate relative to the other of the screen and the substrate, in at least one cycle, and thereby produce respective clearances between respective inner surfaces of the through-holes of the screen and the print material printed on the print surface of the substrate, wherein the clearance-produce control portion controls the second moving device to move said at least one of the screen and the substrate relative to said other of the screen and the substrate, in said at least one cycle, on said plane parallel to the print surface of the substrate, in each of an X-axis direction and a Y-axis direction parallel to an X axis and a Y axis, respectively, which are perpendicular to each other on said plane.

20. A screen printing apparatus, comprising:

a screen holding device which holds a screen having a plurality of through-holes;

a substrate holding device which holds a substrate;

a first moving device which moves at least one of the screen and the substrate toward, and away from, the other of the screen and the substrate, so that the screen and the substrate are contacted with, and separated from, each other;

a filling device which fills, in a state in which the screen is contacted with a print surface of the substrate, the through-holes with a print material and thereby prints the print material on the print surface of the substrate;

a second moving device which moves, in said state in which the screen is contacted with the substrate, at least one of the screen holding device and the substrate holding device relative to the other of the screen holding device and the substrate holding device, on a plane parallel to the print surface of the substrate; and a control device which controls the first moving device, the filling device, and the second moving device, the control device comprising a clearance-produce control portion which controls the second moving device to move at least one of the screen and the substrate relative to the other of the screen and the substrate, in at least one cycle, and thereby produce respective clearances between respective inner surfaces of the through-holes of the screen and the print material printed on the print surface of the substrate, wherein the clearance-produce control portion controls the second moving device to move said at least one of the screen and the substrate relative to said other of the screen and the substrate, to describe such a relative-movement locus that an arbitrary point on the screen moves, relative to the substrate, from an initial position of the arbitrary point, along a spiral curve whose diameter increases as the arbitrary point moves at least one time around the initial position.

21. A screen printing apparatus, comprising:

a screen holding device which holds a screen having a plurality of through-holes;

a substrate holding device which holds a substrate;

a first moving device which moves at least one of the screen and the substrate toward, and away from, the other of the screen and the substrate, so that the screen and the substrate are contacted with, and separated from, each other;

a filling device which fills, in a state in which the screen is contacted with a print surface of the substrate, the through-holes with a print material and thereby prints the print material on the print surface of the substrate;

a second moving device which moves, in said state in which the screen is contacted with the substrate, at least one of the screen holding device and the substrate holding device relative to the other of the screen holding device and the substrate holding device, on a plane parallel to the print surface of the substrate; and a control device which controls the first moving device, the filling device, and the second moving device, the control device comprising a clearance-produce control portion which controls the second moving device to move at least one of the screen and the substrate relative to the other of the screen and the substrate, in at least one cycle, and thereby produce respective clearances between respective inner surfaces of the through-holes of the screen and the print material printed on the print surface of the substrate, wherein the clearance-produce control portion controls the second moving device to move said at least one of the screen and the substrate relative to said other of the screen and the substrate, to describe a circle whose center is an arbitrary point on the screen.

22. A screen printing apparatus, comprising:

a screen holding device which holds a screen having a plurality of through-holes;

a substrate holding device which holds a substrate;

a first moving device which moves at least one of the screen and the substrate toward, and away from, the other of the screen and the substrate, so that the screen and the substrate are contacted with, and separated from, each other;

a filling device which fills, in a state in which the screen is contacted with a print surface of the substrate, the through-holes with a print material and thereby prints the print material on the print surface of the substrate;

a second moving device which moves, in said state in which the screen is contacted with the substrate, at least one of the screen holding device and the substrate holding device relative to the other of the screen holding device and the substrate holding device, on a plane parallel to the print surface of the substrate, in at least one direction parallel to at least one straight line; and a control device which controls the first moving device, the filling device, and the second moving device, the control device comprising a clearance-produce control portion which controls the second moving device to move at least one of the screen and the substrate relative to the other of the screen and the substrate, in at least one cycle, and thereby produce respective clearances between respective inner surfaces of the through-holes of the screen and the print material printed on the print surface of the substrate, wherein a period of said one cycle is not shorter than 0.001 second and not longer than 1 second.

23. A screen printing apparatus, comprising:

a screen holding device which holds a screen having a plurality of through-holes;

a substrate holding device which holds a substrate;

a first moving device which moves at least one of the screen and the substrate toward, and away from, the other of the screen and the substrate, so that the screen and the substrate are contacted with, and separated from, each other;

a filling device which fills, in a state in which the screen is contacted with a print surface of the substrate, the through-holes with a print material and thereby prints the print material on the print surface of the substrate;

a second moving device which moves, in said state in which the screen is contacted with the substrate, at least one of the screen holding device and the substrate holding device relative to the other of the screen holding device and the substrate holding device, on a plane parallel to the print surface of the substrate, in at least one direction parallel to at least one straight line; and a control device which controls the first moving device, the filling device, and the second moving device, the control device comprising a clearance-produce control portion which controls the second moving device to move at least one of the screen and the substrate relative to the other of the screen and the substrate, in at least one cycle, and thereby produce respective clearances between respective inner surfaces of the through-holes of the screen and the print material printed on the print surface of the substrate, wherein the control device further comprising a vibration control portion which simultaneously vibrates, when the clearance-produce control portion controls the second moving device to move said at least one of the screen and the substrate relative to said other of the screen and the substrate in said at least one cycle, at least one of the screen and the substrate at a period shorter than a period of said one cycle.

24. A screen-printing apparatus, comprising:

a screen holding device which holds a screen having a plurality of through-holes;

a substrate holding device which holds a substrate;

a first moving device which moves at least one of the screen and the substrate toward, and away from, the other of the screen and the substrate, so that the screen and the substrate are contacted with, and separated from, each other;

a filling device which fills, in a state in which the screen is contacted with a print surface of the substrate, the through-holes with a print material and thereby prints the print material on the print surface of the substrate;

a second moving device which moves, in said state in which the screen is contacted with the substrate, at least one of the screen holding device and the substrate holding device relative to the other of the screen holding device and the substrate holding device, on a plane parallel to the print surface of the substrate, in at least one direction parallel to at least one straight line;

a control device which controls the first moving device, the filling device, and the second moving device, the control device comprising a clearance-produce control portion which controls the second moving device to move at least one of the screen and the substrate relative to the other of the screen and the substrate, in at least one cycle, and thereby produce respective clearances between respective inner surfaces of the through-holes of the screen and the print material printed on the print surface of the substrate; and a positional-error detecting device which detects at least one positional error between the screen and the substrate in said at least one direction parallel to the print surface of the substrate, wherein the control device further comprises a position-correct control portion which controls, based on the positional error detected by the positional-error detecting device, the second moving device to reduce the detected positional error.

* * * * *